(12) United States Patent
Kawashima et al.

(10) Patent No.: US 12,204,212 B2
(45) Date of Patent: Jan. 21, 2025

(54) DISPLAY APPARATUS AND ELECTRONIC DEVICE

(71) Applicant: Semiconductor Energy Laboratory Co., Ltd., Atsugi (JP)

(72) Inventors: Susumu Kawashima, Atsugi (JP); Naoto Kusumoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 18/599,770

(22) Filed: Mar. 8, 2024

(65) Prior Publication Data

US 2024/0248355 A1 Jul. 25, 2024

Related U.S. Application Data

(63) Continuation of application No. 17/612,384, filed as application No. PCT/IB2020/054663 on May 18, 2020, now Pat. No. 11,988,926.

(30) Foreign Application Priority Data

May 30, 2019 (JP) .................. 2019-101319

(51) Int. Cl.
*G02F 1/1362* (2006.01)
*G02F 1/1368* (2006.01)
*H01L 27/12* (2006.01)

(52) U.S. Cl.
CPC .... *G02F 1/136213* (2013.01); *G02F 1/13624* (2013.01); *G02F 1/1368* (2013.01); *H01L 27/1255* (2013.01)

(58) Field of Classification Search
None
See application file for complete search history.

(56) References Cited

U.S. PATENT DOCUMENTS 7,674,650 B2   3/2010   Akimoto et al.
7,732,819 B2   6/2010   Akimoto et al.
(Continued)

FOREIGN PATENT DOCUMENTS

CN   001941299 A    4/2007
CN   101335212 A   12/2008
(Continued)

OTHER PUBLICATIONS

International Search Report (Application No. PCT/IB2020/054663) Dated Sep. 8, 2020.
(Continued)

*Primary Examiner* — Ryan Crockett
(74) *Attorney, Agent, or Firm* — Eric J. Robinson; Robinson Intellectual Property Law Office, P.C.

(57) ABSTRACT

A display apparatus having an excellent boosting function is provided. The display apparatus is provided with a pixel having a function of adding data (a boosting function). A capacitor for boosting voltage is provided in the pixel, and data is added by capacitive coupling to be supplied to a display device. The capacitor for boosting voltage and a capacitor for retaining data are placed on top of each other, whereby the capacitance value of the capacitor for boosting voltage can be increased. Thus, the pixel can have an excellent boosting function, without significantly losing the aperture ratio or definition.

12 Claims, 30 Drawing Sheets

(56) References Cited

U.S. PATENT DOCUMENTS

| | | | |
|---|---|---|---|
| 7,910,490 B2 | 3/2011 | Akimoto et al. | |
| 2004/0183978 A1 | 9/2004 | Jeoung | |
| 2005/0012110 A1 | 1/2005 | Kim | |
| 2006/0121310 A1* | 6/2006 | Sun | H10K 59/1216 257/E27.113 |
| 2007/0072439 A1 | 3/2007 | Akimoto et al. | |
| 2008/0308796 A1 | 12/2008 | Akimoto et al. | |
| 2008/0308797 A1 | 12/2008 | Akimoto et al. | |
| 2008/0308804 A1 | 12/2008 | Akimoto et al. | |
| 2008/0308805 A1 | 12/2008 | Akimoto et al. | |
| 2011/0101334 A1 | 5/2011 | Yamazaki et al. | |
| 2012/0104405 A1 | 5/2012 | Choi et al. | |
| 2013/0063330 A1 | 3/2013 | Eom | |
| 2015/0008395 A1 | 1/2015 | Yoon et al. | |
| 2015/0179802 A1 | 6/2015 | Kim et al. | |
| 2015/0187861 A1 | 7/2015 | Kim et al. | |
| 2016/0300864 A1 | 10/2016 | Seo et al. | |
| 2017/0077207 A1* | 3/2017 | Kim | H01L 27/124 |
| 2017/0102577 A1* | 4/2017 | Chien | G02F 1/136286 |
| 2018/0149911 A1 | 5/2018 | Yamaguchi et al. | |
| 2020/0142229 A1* | 5/2020 | Kusunoki | G02F 1/136286 |
| 2020/0175905 A1 | 6/2020 | Yamazaki et al. | |
| 2020/0194527 A1* | 6/2020 | Kawashima | G09G 3/3275 |
| 2024/0013715 A1* | 1/2024 | Li | G09G 3/32 |

FOREIGN PATENT DOCUMENTS

| | | |
|---|---|---|
| CN | 101335274 A | 12/2008 |
| CN | 102456623 A | 5/2012 |
| CN | 202695445 U | 1/2013 |
| CN | 103000654 A | 3/2013 |
| CN | 104376813 A | 2/2015 |
| CN | 104752471 A | 7/2015 |
| CN | 107533819 A | 1/2018 |
| CN | 108010494 A | 5/2018 |
| EP | 1770788 A | 4/2007 |
| EP | 1995787 A | 11/2008 |
| EP | 1998373 A | 12/2008 |
| EP | 1998374 A | 12/2008 |
| EP | 1998375 A | 12/2008 |
| EP | 2568504 A | 3/2013 |
| EP | 2889912 A | 7/2015 |
| EP | 3614442 A | 2/2020 |
| JP | 2006-186320 A | 7/2006 |
| JP | 2007-096055 A | 4/2007 |
| JP | 2007-123861 A | 5/2007 |
| JP | 2011-119674 A | 6/2011 |
| JP | 2013-057921 A | 3/2013 |
| KR | 2012-0046356 A | 5/2012 |
| KR | 2013-0027845 A | 3/2013 |
| KR | 2015-0006151 A | 1/2015 |
| KR | 2015-0073297 A | 7/2015 |
| KR | 2015-0078344 A | 7/2015 |
| TW | 201312819 | 3/2013 |
| WO | WO-2016/190187 | 12/2016 |

OTHER PUBLICATIONS

Written Opinion (Application No. PCT/IB2020/054663) Dated Sep. 8, 2020.

* cited by examiner

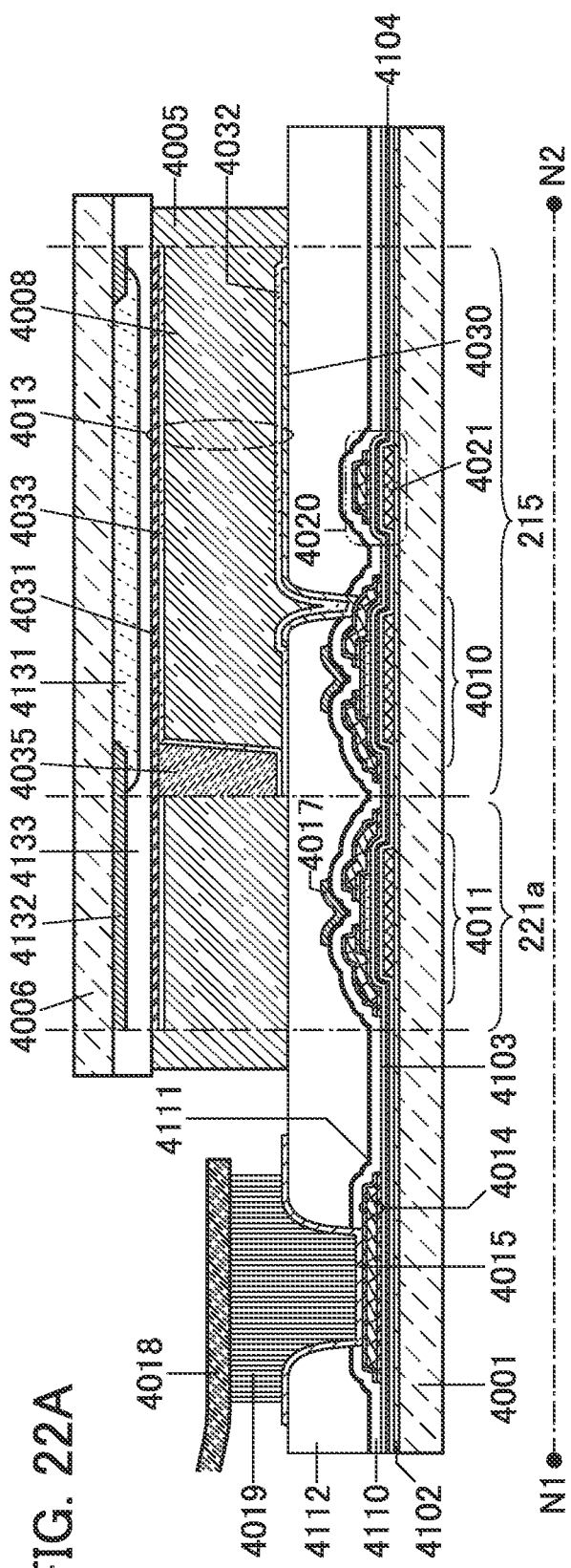
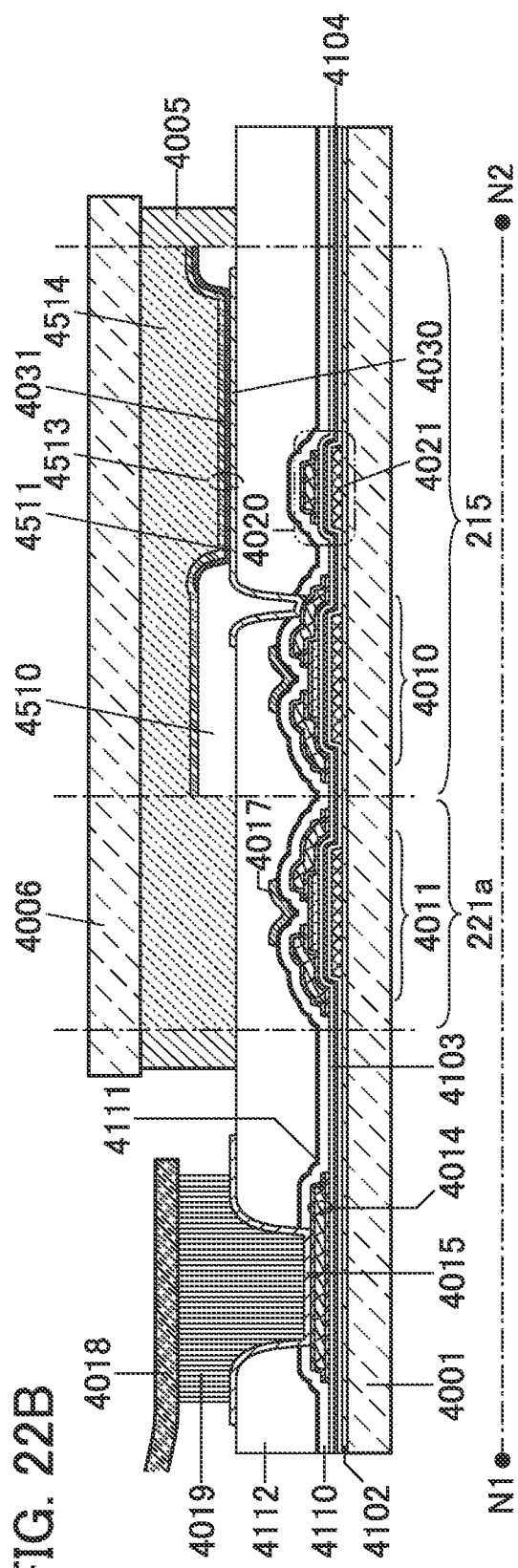
FIG. 22A
FIG. 22B

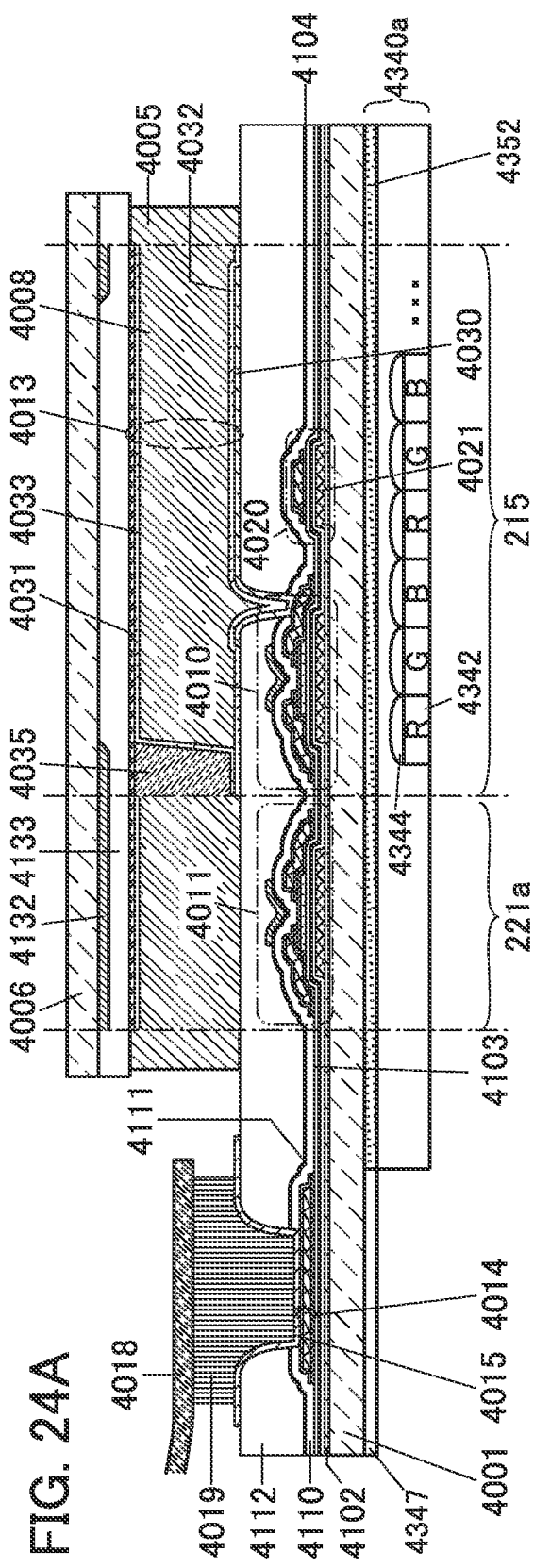
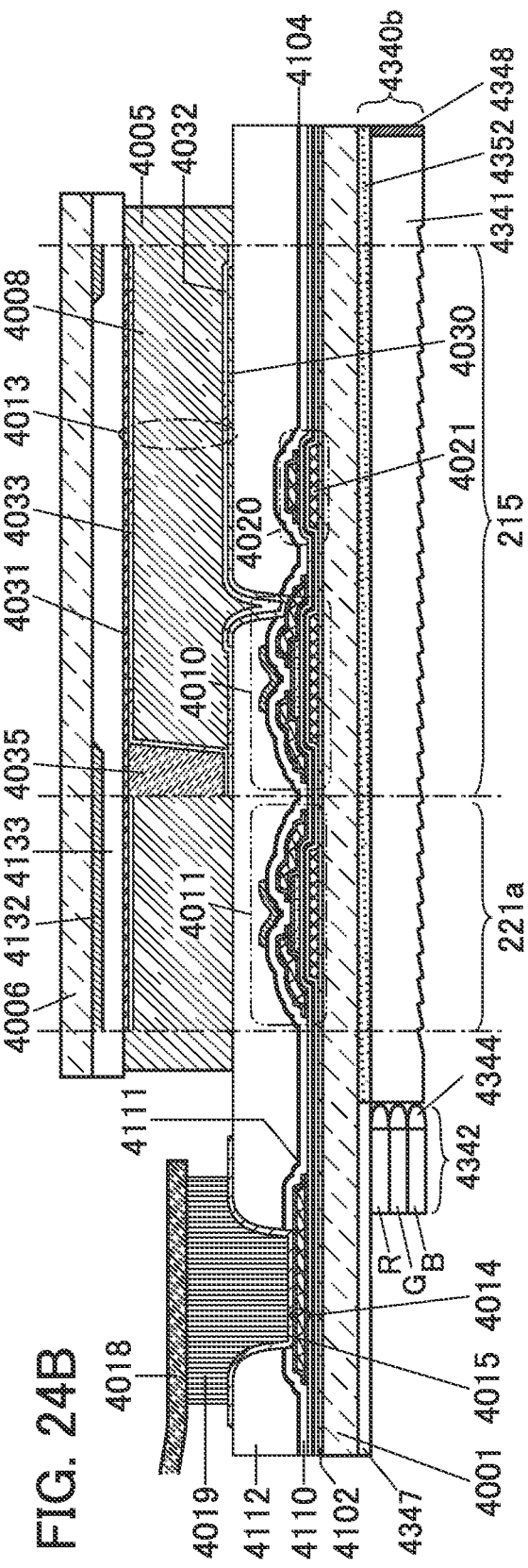
FIG. 24A
FIG. 24B

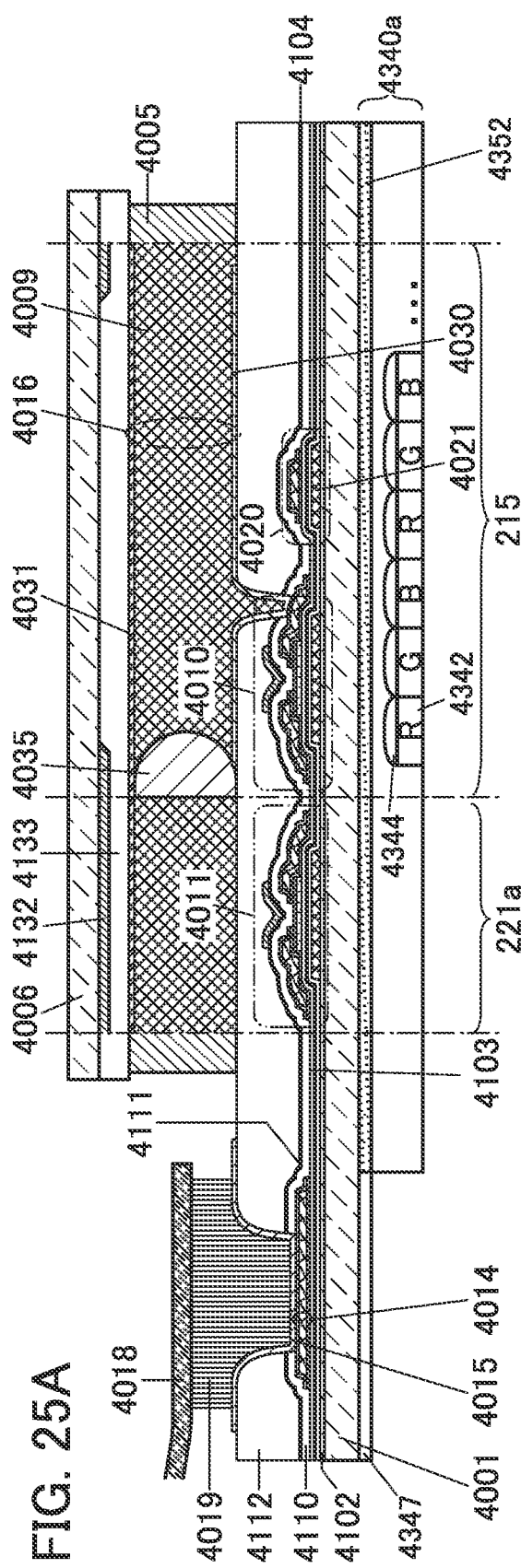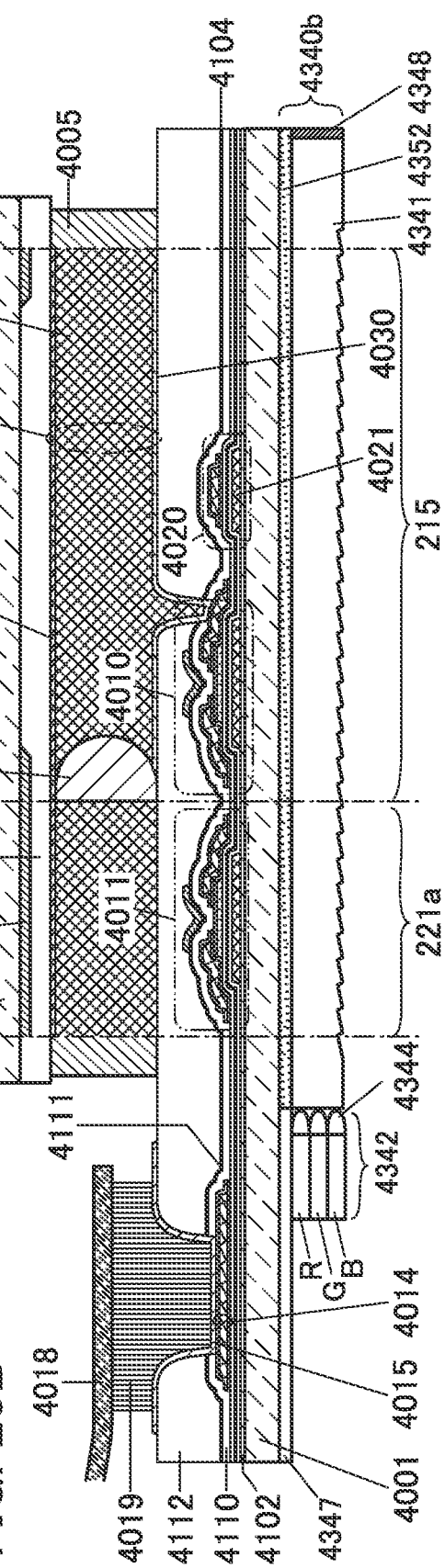

DISPLAY APPARATUS AND ELECTRONIC DEVICE

TECHNICAL FIELD

One embodiment of the present invention relates to a display apparatus.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Accordingly, more specific examples of the technical field of one embodiment of the present invention disclosed in this specification include a semiconductor device, a display apparatus, a liquid crystal display apparatus, a light-emitting apparatus, a lighting device, a power storage device, a memory device, an imaging device, an operation method thereof, and a manufacturing method thereof.

In this specification and the like, a semiconductor device generally means a device that can function by utilizing semiconductor characteristics. A transistor and a semiconductor circuit are embodiments of semiconductor devices. In some cases, a memory device, a display apparatus, an imaging device, or an electronic device includes a semiconductor device.

BACKGROUND ART

A technique for forming transistors using a metal oxide formed over a substrate has been attracting attention. For example, a technique in which a transistor formed using zinc oxide or In—Ga—Zn-based oxide is used as a switching element or the like of a pixel of a display apparatus is disclosed in Patent Document 1 and Patent Document 2.

Patent Document 3 discloses a memory device having a configuration in which a transistor with an extremely low off-state current is used in a memory cell.

REFERENCE

Patent Document

[Patent Document 1] Japanese Published Patent Application No. 2007-123861
[Patent Document 2] Japanese Published Patent Application No. 2007-96055
[Patent Document 3] Japanese Published Patent Application No. 2011-119674

SUMMARY OF THE INVENTION

Problems to be Solved by the Invention

To drive a dispersed liquid crystal device and a tandem light-emitting device, higher voltage than the drive voltage of a general display device is required.

In such a case, a high-output source driver is used. Alternatively, a boosting function may be provided in a pixel circuit to generate voltage higher than the output of a source driver and supply the voltage to the display device. In the former case, a general pixel circuit can be used; however, there is a problem of the cost and power consumption of the source driver being high.

In the latter case, a general source driver can be used. In addition, using a boosting function for driving a general display device can reduce the output voltage of the source driver. However, in the case where a pixel is provided with a boosting function, it is necessary to add components such as a transistor, a capacitor, and a wiring. Thus, the boosting ability and the aperture ratio or definition of a pixel have a trade-off relationship.

An object of one embodiment of the present invention is to provide a display apparatus having an excellent boosting function. Another object is to provide a display apparatus having an excellent boosting function and a high aperture ratio or high definition. Another object is to provide a display apparatus capable of supplying voltage higher than or equal to the output voltage of a source driver to a display device. Another object is to provide a display apparatus capable of enhancing the luminance of a displayed image.

Another object is to provide a display apparatus with low power consumption. Another object is to provide a highly reliable display apparatus. Another object is to provide a novel display apparatus or the like. Another object is to provide a method for driving any of the above display apparatuses. Another object is to provide a novel semiconductor device or the like.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention relates to a display apparatus having an excellent boosting function.

One embodiment of the present invention is a display apparatus including, in a pixel, a first capacitor, a second capacitor, and a display element. The first capacitor and the second capacitor are electrically connected to the display element, the first capacitor has a structure in which a first conductive layer, a first dielectric layer, and a second conductive layer are stacked in this order, the second capacitor has a structure in which the second conductive layer, a second dielectric layer, and a third conductive layer are stacked in this order, and the first capacitor and the second capacitor include a region where the first capacitor and the second capacitor overlap with each other.

It is preferable that the second capacitor have a capacitance value larger than that of the first capacitor.

The pixel may further include a first transistor, a second transistor, and a third transistor, one of a source and a drain of the first transistor may be electrically connected to the second conductive layer, and one of a source and a drain of the second transistor and one of a source and a drain of the third transistor may be electrically connected to the third conductive layer.

The pixel may include a light-emitting element as the display element, the pixel may further include a fourth transistor and a fifth transistor, a gate of the fourth transistor may be electrically connected to the second conductive layer, and one of a source and a drain of the fourth transistor, one of a source and a drain of the fifth transistor, and one electrode of the light-emitting element may be electrically connected to the third conductive layer.

Alternatively, the pixel may include a liquid crystal element as the display element, and one electrode of the liquid crystal element may be electrically connected to the second conductive layer.

It is preferable that the first transistor to the third transistor include a metal oxide in a channel formation region. The second conductive layer may include a metal oxide. It is preferable that the metal oxide include In, Zn, and M (M is Al, Ti, Ga, Ge, Sn, Y, Zr, La, Ce, Nd, or Hf).

Effect of the Invention

With the use of one embodiment of the present invention, a display apparatus having an excellent boosting function can be provided. Alternatively, a display apparatus having an excellent boosting function and a high aperture ratio or high definition can be provided. Alternatively, a display apparatus capable of supplying voltage higher than or equal to the output voltage of a source driver to a display device can be provided. Alternatively, a display apparatus capable of enhancing the luminance of a displayed image can be provided.

Alternatively, a display apparatus with low power consumption can be provided. Alternatively, a highly reliable display apparatus can be provided. Alternatively, a novel display apparatus or the like can be provided. Alternatively, a method for operating any of the above display apparatuses can be provided. Alternatively, a novel semiconductor device or the like can be provided.

BRIEF DESCRIPTION OF THE DRAWINGS

FIG. 22A and FIG. 22B are diagrams illustrating display apparatuses.
FIG. 24A and FIG. 24B are diagrams illustrating display apparatuses.
FIG. 25A and FIG. 25B are diagrams illustrating display apparatuses.

MODE FOR CARRYING OUT THE INVENTION

Figure 1:
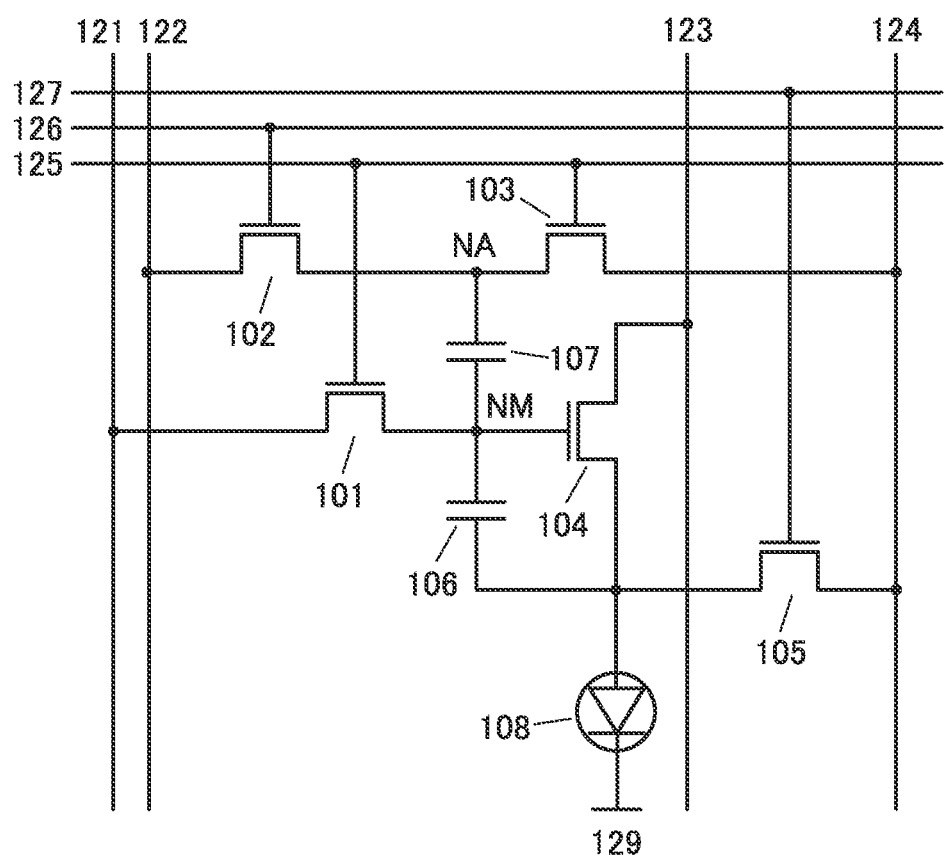
FIG. 1 is a diagram illustrating a pixel circuit.

Embodiments are described in detail with reference to the drawings. However, the present invention is not limited to the following description, and it is readily appreciated by those skilled in the art that modes and details can be modified in various ways without departing from the spirit and the scope of the present invention. Therefore, the present invention should not be interpreted as being limited to the descriptions of embodiments below. Note that in structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Even in the case where a single component is illustrated in a circuit diagram, the component may be composed of a plurality of parts as long as there is no functional inconvenience. For example, in some cases, a plurality of transistors that operate as a switch are connected in series or in parallel. In some cases, capacitors are divided and arranged in a plurality of positions.

In addition, one conductor has a plurality of functions such as a wiring, an electrode, and a terminal in some cases. In this specification, a plurality of names are used for the same component in some cases. Even in the case where elements are illustrated in a circuit diagram as if they were directly connected to each other, the elements may actually be connected to each other through one conductor or a plurality of conductors. In this specification, even such a configuration is included in direct connection.

Embodiment 1

In this embodiment, a display apparatus of one embodiment of the present invention will be described with reference to drawings.

One embodiment of the present invention is a display apparatus provided with a pixel having a function of adding data (a boosting function). The pixel has a function of adding first data and second data supplied from a source driver to generate third data, and supplying the third data to a display device (also referred to as a display element). Thus, voltage that is higher than or equal to the voltage output from the source driver can be supplied to the display device, and the display device with relatively high operating voltage can be operated with a general source driver. Alternatively, the output voltage of the source driver can be reduced and the display device can be operated with low power.

To enhance the boosting function, a capacitor with a relatively high capacitance value is preferably used. However, the area of the capacitor and the aperture ratio of a pixel or the definition of a pixel array have a trade-off relationship. In one embodiment of the present invention, a capacitor for boosting voltage and a capacitor for retaining data are placed on top of each other, whereby the area occupied by and the capacitance value of the capacitor for boosting voltage are increased. Thus, the pixel can have an excellent boosting function, without significantly losing the aperture ratio or definition.

FIG. 1 is a circuit diagram of a pixel included in a display apparatus of one embodiment of the present invention. The pixel includes a transistor 101, a transistor 102, a transistor 103, a transistor 104, a transistor 105, a capacitor 106, a capacitor 107, and a light-emitting device 108. Note that the light-emitting device is also referred to as a light-emitting element.

One of a source and a drain of the transistor 101 is electrically connected to one electrode of the capacitor 107, a gate of the transistor 104, and one electrode of the capacitor 106. The other electrode of the capacitor 107 is electrically connected to one of a source and a drain of the transistor 102 and one of a source and a drain of the transistor 103. One of a source and a drain of the transistor 104 is electrically connected to one of a source and a drain of the transistor 105, one electrode of the light-emitting device 108, and the other electrode of the capacitor 106.

The capacitor 107 has a function of adding data by capacitive coupling. That is, the pixel has a boosting function. The capacitor 106 has a function of retaining data.

FIG. 1 and the above description show that the capacitor 106 and the capacitor 107 are electrically connected in series. Thus, a common conductive layer can be used for the one electrode of the capacitor 106 and the one electrode of the capacitor 107.

Figure 2A:
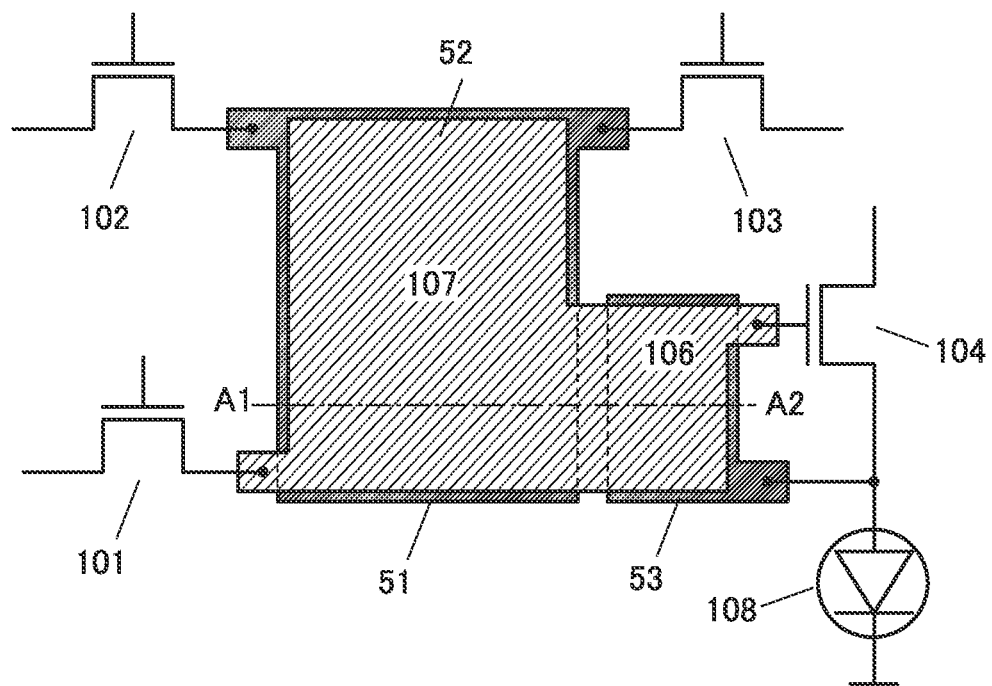
FIG. 2A and FIG. 2B are diagrams illustrating structures of capacitors.
Figure 2B:
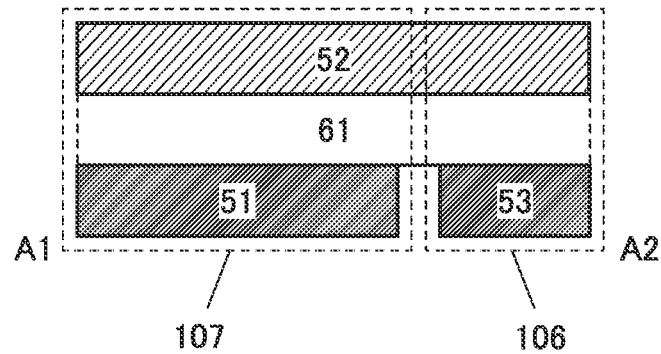

FIG. 2A and FIG. 2B are a conventional example of layout, showing a simple layout of the capacitor 106 and the capacitor 107 in the pixel circuit illustrated in FIG. 1. FIG. 2A is a top view, showing electrical connection with other components in a simplified way. FIG. 2B is a cross-sectional view taken along a dashed-dotted line A1-A2 in FIG. 2A.

The capacitor 107 has a structure in which a conductive layer 51, a dielectric layer 61, and a conductive layer 52 are stacked. The capacitor 106 has a structure in which a conductive layer 53, the dielectric layer 61, and the conductive layer 52 are stacked. The conductive layer 51 and the conductive layer 53 can be formed from a conductor film deposited in the same step. In addition, the conductive layer 52 can be a common electrode.

As described above, the formation processes and structures of the capacitor 106 and the capacitor 107 are simple; however, as they are formed next to each other in a limited area, their capacitance values have a trade-off relationship.

Figure 3A:
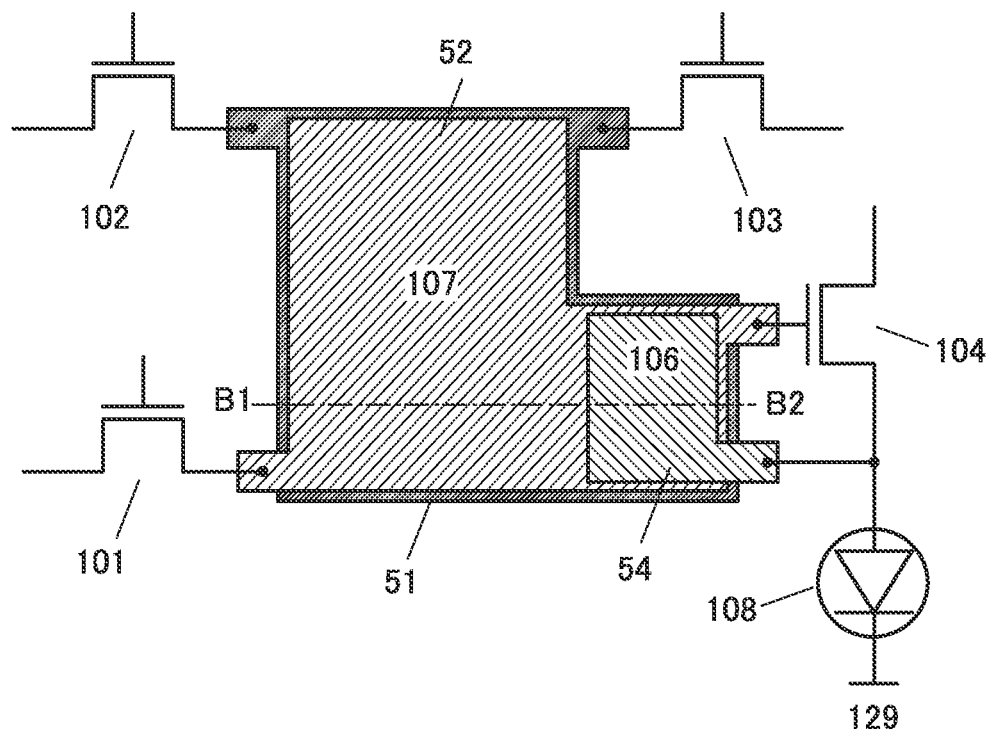
FIG. 3A and FIG. 3B are diagrams illustrating structures of capacitors.
Figure 3B:
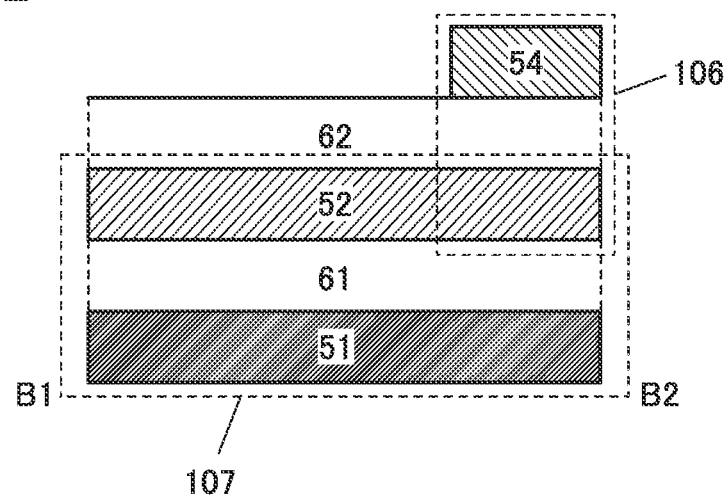

FIG. 3A and FIG. 3B are drawings illustrating a simple layout of the capacitor 106 and the capacitor 107 in one embodiment of the present invention. FIG. 3A is a top view, showing electrical connection with other components in a simplified way. FIG. 3B is a cross-sectional view taken along a dashed-dotted line B1-B2 in FIG. 3A.

The capacitor 107 can have a structure in which the conductive layer 51, the dielectric layer 61, and the conductive layer 52 are stacked. The capacitor 106 can have a structure in which the conductive layer 52, a dielectric layer 62, and a conductive layer 54 are stacked.

That is, the capacitor 106 and the capacitor 107 can have a region where they overlap with each other, with the conductive layer 52 as the common electrode. Thus, the capacitor 106 and the capacitor 107 are less affected by the area limitation, and the degree of freedom in design can be improved.

The capacitor 107 can be placed in a region where the capacitor 106 is placed in the conventional example, whereby the capacitance value thereof can be increased. The fact that the area (the capacitance value) of the capacitor 107 can be increased is effective for improving the boosting function. In addition, since components that form transistors or the like are used for the dielectric layer 62 and the conductive layer 54, there is no additional step. The details of the boosting function and a specific layout will be described later.

Connections between the components of the pixels and a variety of wirings in FIG. 1 are described. A gate of the transistor 101 is electrically connected to a wiring 125. A gate of the transistor 102 is electrically connected to a wiring 126. A gate of the transistor 103 is electrically connected to the wiring 125. A gate of the transistor 105 is electrically connected to a wiring 127.

The other of the source and the drain of the transistor 101 is electrically connected to a wiring 121. The other of the source and the drain of the transistor 102 is electrically connected to a wiring 122. The other of the source and the drain of the transistor 103 is electrically connected to a wiring 124. The other of the source and the drain of the transistor 104 is electrically connected to a wiring 123. The other of the source and the drain of the transistor 105 is electrically connected to the wiring 124. The other electrode of the light-emitting device 108 is electrically connected to a wiring 129.

The wirings 125, 126, and 127 each have a function of a gate line and can be electrically connected to a gate driver. The wirings 121 and 122 each have a function of a source line and can be electrically connected to the source driver.

The wirings 123 and 129 can each have a function of a power supply line. When a high potential is supplied to the wiring 123 and a low potential is supplied to the wiring 129, for example, the light-emitting device 108 can perform a forward bias operation (light emission).

The wiring 124 can have a function of supplying a reference potential ($V_{ref}$). For example, 0 V, a GND potential, or the like can be used as "$V_{ref}$". Alternatively, "$V_{ref}$" may be a particular potential.

Here, a wiring that connects the one of the source and the drain of the transistor 101, the one electrode of the capacitor 106, the one electrode of the capacitor 107, and the gate of the transistor 104 is referred to as a node NM. A wiring that connects the one of the source and the drain of the transistor 102, the other electrode of the capacitor 107, and the one of the source and the drain of the transistor 103 is referred to as a node NA.

The transistor 101 can have a function of writing the potential of the wiring 121 to the node NM. The transistor 102 can have a function of writing the potential of the wiring 122 to the node NA. The transistor 103 can have a function of supplying the reference potential ($V_{ref}$) to the node NA. The transistor 104 can have a function of controlling a current flowing into the light-emitting device 108 in accordance with the potential of the node NM. The transistor 105 can have a function of fixing the source potential of the transistor 104 in data writing to the node NM and a function of controlling the timing of the operation of the light-emitting device 108.

The node NM is connected to the node NA through the capacitor 107. Thus, when the node NM is in a floating state, the amount of the change in potential of the node NA can be added by capacitive coupling. The addition of the potential in the node NM will be described below.

First, the first data (weight: "W") is written to the node NM. At this time, the reference potential "$V_{ref}$" is supplied to the node NA, and the capacitor 107 is made to retain "W−$V_{ref}$". Next, the node NA is set to be floating and the second data (data: "D") is supplied to the node NA.

At this time, when the capacitance value of the capacitor 107 is $C_{107}$ and the capacitance value of the node NM is $C_{NM}$, the potential of the node NM becomes "W($C_{107}$/($C_{107}$+$C_{NM}$))×(D−$_{ref}$V)". Here, when the value of C is increased so that the value of $C_{NM}$ can be ignored, $C_{107}$/($C_{107}$+$C_{NM}$) becomes close to 1, and the potential of the node NM can be regarded as "W+D−$V_{ref}$".

Therefore, when "W"="D", "$V_{ref}$"=0 V, and $C_{107}$ is sufficiently larger than $C_{NM}$, the potential of the node NM becomes close to "2D". In other words, the third data ("2D"), which is a potential approximately twice the output of the source driver, can be supplied to the node NM.

Note that when "$V_{ref}$" is "−W" or "−D", the potential of the node NM can be close to "3D" too.

The boosting function of the pixel enables voltage required for the operation of the light-emitting device 108 to be generated by even when the output voltage of the source driver is low, so that the light-emitting device 108 can operate appropriately.

As described above, it is preferable that the capacitance value of the capacitor 107 be sufficiently larger than the capacitance value of the node NM (including the capacitor 106). In one embodiment of the present invention, the capacitor 106 and the capacitor 107 are formed to have a region where they overlap with each other, which makes it easier to increase the area occupied by the capacitor 107 in the pixel. In other words, the capacitance value of the capacitor 107 is easily increased, which can improve the above-described potential addition function (the boosting function).

The node NM and the node NA function as retention nodes. When the transistor connected to the corresponding node is turned on, data can be written to the node. When the transistor is turned off, the data can be retained in the node. The use of a transistor with an extremely low off-state current as the transistor enables leakage current to be reduced and the potential of the node to be retained for a long time. As the transistor, a transistor using a metal oxide in a channel formation region (hereinafter, OS transistor) is preferably used, for example.

Specifically, OS transistors are preferably used as any of the transistors 101, 102, and 103. Alternatively, OS transistors may be used as all of the transistors included in the pixel. In the case of operating within a range where the amount of leakage current is acceptable, a transistor containing Si in a channel formation region (hereinafter, Si transistor) may be used. Alternatively, an OS transistor and a Si transistor may be used together. Examples of the Si transistor include a transistor containing amorphous silicon and a transistor containing crystalline silicon (microcrystalline silicon, low-temperature polysilicon, or single crystal silicon).

As a semiconductor material used for an OS transistor, a metal oxide whose energy gap is greater than or equal to 2 eV, preferably greater than or equal to 2.5 eV, more preferably greater than or equal to 3 eV can be used. A typical example is an oxide semiconductor containing indium, and a CAAC-OS or a CAC-OS described later can be used, for example. A CAAC-OS has a crystal structure including stable atoms and is suitable for a transistor that is required to have high reliability, and the like. A CAC-OS has high mobility and is suitable for a transistor that operates at high speed, and the like.

In the OS transistor, the semiconductor layer has a large energy gap, and thus the OS transistor can have an extremely low off-state current of several yA/μm (current per micrometer of a channel width). An OS transistor has features such that impact ionization, an avalanche breakdown, a short-channel effect, or the like does not occur, which are different from those of a Si transistor. Thus, the use of an OS transistor enables formation of a highly reliable circuit. Moreover, variations in electrical characteristics due to crystallinity unevenness, which are caused in Si transistors, are less likely to occur in OS transistors.

The semiconductor layer included in the OS transistor can be, for example, a film represented by an In-M-Zn-based oxide that contains indium, zinc, and M (M is one or more of metals such as aluminum, titanium, gallium, germanium, yttrium, zirconium, lanthanum, cerium, tin, neodymium, and hafnium). The In-M-Zn-based oxide can be typically formed by a sputtering method. Alternatively, the In-M-Zn-based oxide can be formed by an ALD (Atomic layer deposition) method.

It is preferable that the atomic ratio of metal elements of a sputtering target used for forming the In-M-Zn-based oxide by a sputtering method satisfy In≥M and Zn≥M. The atomic ratio between metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio between metal elements in the deposited semiconductor layer may vary from the above atomic ratio between metal elements in the sputtering target in a range of ±40%.

An oxide semiconductor with low carrier density is used for the semiconductor layer. For example, an oxide semiconductor whose carrier density is lower than or equal to $1 \times 10^{17}/cm^3$, preferably lower than or equal to $1 \times 10^{15}/cm^3$, further preferably lower than or equal to $1 \times 10^{13}/cm^3$, still further preferably lower than or equal to $1 \times 10^{11}/cm^3$, yet further preferably lower than $1 \times 10^{10}/cm^3$, and higher than or equal to $1 \times 10^{-9}/cm^3$ can be used for the semiconductor layer. Such an oxide semiconductor is referred to as a highly purified intrinsic or substantially highly purified intrinsic oxide semiconductor. The oxide semiconductor has a low density of defect states and can thus be regarded as an oxide semiconductor having stable characteristics.

Note that, examples of a material for the semiconductor layer are not limited to those described above, and a material with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When the oxide semiconductor in the semiconductor layer contains silicon or carbon, which is an element belonging to Group 14, the amount of oxygen vacancies is increased in the semiconductor layer, and the semiconductor layer becomes n-type. Thus, the concentration of silicon or carbon (the concentration obtained by secondary ion mass spectrometry) in the semiconductor layer is set to $2\times10^{18}$ atoms/cm$^3$ or lower, preferably $2\times10^{17}$ atoms/cm$^3$ or lower.

An alkali metal and an alkaline earth metal might generate carriers when bonded to an oxide semiconductor, in which case the off-state current of the transistor might be increased. Thus, the concentration of alkali metal or alkaline earth metal in the semiconductor layer (the concentration obtained by secondary ion mass spectrometry) is set to $1\times10^{18}$ atoms/cm$^3$ or lower, preferably $2\times10^{16}$ atoms/cm$^3$ or lower.

When the oxide semiconductor in the semiconductor layer contains nitrogen, electrons functioning as carriers are generated and the carrier density increases, so that the semiconductor layer easily becomes n-type. Thus, a transistor using an oxide semiconductor that contains nitrogen is likely to be normally on. Hence, the concentration of nitrogen in the semiconductor layer (the concentration obtained by secondary ion mass spectrometry) is preferably set to $5\times10^{18}$ atoms/cm$^3$ or lower.

Specifically, when hydrogen is contained in an oxide semiconductor included in the semiconductor layer, hydrogen reacts with oxygen bonded to a metal atom to be water, and thus sometimes causes an oxygen vacancy in the oxide semiconductor. If the channel formation region in the oxide semiconductor includes oxygen vacancies, the transistor sometimes has normally-on characteristics. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor including an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defects quantitatively. Thus, the defects in the oxide semiconductor are sometimes evaluated not by its donor concentration but by its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, hydrogen in the oxide semiconductor is preferably reduced as much as possible. Specifically, the hydrogen concentration in the oxide semiconductor obtained by secondary ion mass spectrometry (SIMS) is lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$. When an oxide semiconductor with a sufficiently low concentration of impurities such as hydrogen is used for a channel formation region of a transistor, the transistor can have stable electrical characteristics.

The semiconductor layer may have a non-single-crystal structure, for example. Examples of a non-single-crystal structure include a CAAC-OS (C-Axis Aligned Crystalline Oxide Semiconductor) including a c-axis aligned crystal, a polycrystalline structure, a microcrystalline structure, and an amorphous structure. Among the non-single-crystal structures, an amorphous structure has the highest density of defect states, whereas the CAAC-OS has the lowest density of defect states.

An oxide semiconductor film having an amorphous structure has disordered atomic arrangement and no crystalline component, for example. In another example, an oxide film having an amorphous structure has a completely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single crystal structure. The mixed film has, for example, a single-layer structure or a layered structure including two or more of the foregoing regions in some cases.

The composition of a CAC (Cloud-Aligned Composite)-OS, which is one embodiment of a non-single-crystal semiconductor layer, will be described below.

The CAC-OS has, for example, a composition in which elements contained in an oxide semiconductor are unevenly distributed. Materials containing unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions containing the metal element(s) are mixed is referred to as a mosaic pattern or a patch-like pattern. The region has a size greater than or equal to 0.5 nm and less than or equal to 10 nm, preferably greater than or equal to 1 nm and less than or equal to 2 nm, or a similar size.

Note that an oxide semiconductor preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0) or gallium zinc oxide (Ga$_{X4}$Zn$_{Y4}$O$_{Z4}$, where X4, Y4, and Z4 are real numbers greater than 0), and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite oxide semiconductor with a composition in which a region containing GaO$_{X3}$ as a main component and a region containing In$_{X2}$Zn$_{Y2}$O$_{Z2}$ or InO$_{X1}$ as a main component are mixed. Note that in this specification, when the atomic ratio of In to an element M in a first region is greater than the atomic ratio of In to an element M in a second region, for example, the first region is described as having higher In concentration than the second region.

Note that a compound containing In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure.

Note that the CAAC structure is a crystal structure in which a plurality of IGZO nanocrystals have c-axis alignment and are connected in the a-b plane direction without alignment.

The CAC-OS relates to the material composition of an oxide semiconductor. In a material composition of a CAC-OS containing In, Ga, Zn, and O, nanoparticle regions containing Ga as a main component are observed in part of the CAC-OS and nanoparticle regions containing In as a main component are observed in part thereof. These nanoparticle regions are randomly dispersed to form a mosaic pattern. Thus, the crystal structure is a secondary element for the CAC-OS.

Note that in the CAC-OS, a layered structure including two or more films with different atomic ratios is not included. For example, a two-layer structure of a film containing In as a main component and a film containing Ga as a main component is not included.

A boundary between the region containing $GaO_{X3}$ as a main component and the region containing $In_{X2}Zn_{Y2}O_{Z2}$ or $InO_{X1}$ as a main component is not clearly observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. In the case where the CAC-OS is formed by a sputtering method, one or more of an inert gas (typically, argon), an oxygen gas, and a nitrogen gas may be used as a deposition gas. The flow rate of the oxygen gas to the total flow rate of the deposition gas in deposition is preferably as low as possible; for example, the flow rate of the oxygen gas is higher than or equal to 0% and lower than 30%, preferably higher than or equal to 0% and lower than or equal to 10%.

The CAC-OS is characterized in that a clear peak is not observed when measurement is conducted using a θ/2θ scan by an out-of-plane method, which is an X-ray diffraction (XRD) measurement method. That is, it is found by the X-ray diffraction measurement that there are no alignment in the a-b plane direction and no alignment in the c-axis direction in the measured areas.

In an electron diffraction pattern of the CAC-OS that is obtained by irradiation with an electron beam with a probe diameter of 1 nm (also referred to as a nanometer-sized electron beam), a ring-like region (ring region) with high luminance and a plurality of bright spots in the ring region are observed. Thus, it is found from the electron diffraction pattern that the crystal structure of the CAC-OS includes an nc (nano-crystal) structure that does not show alignment in the plane direction and the cross-sectional direction.

For example, energy dispersive X-ray spectroscopy (EDX) is used to obtain EDX mapping, and according to the EDX mapping, the CAC-OS of the In—Ga—Zn oxide has a composition in which the region containing $GaO_{X3}$ as a main component and the region containing $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, the region containing $GaO_{X3}$ or the like as a main component and the region containing $In_{X2}Zn_{Y2}O_{Z2}$ or $InO_{X1}$ as a main component are separated to form a mosaic pattern.

The conductivity of the region containing $In_{X2}Zn_{Y2}O_{Z2}$ or $InO_{X1}$ as a main component is higher than that of the region containing $GaO_{X3}$ or the like as a main component. In other words, when carriers flow through the region containing $In_{X2}Zn_{Y2}O_{X2}$ or $InO_{X1}$ as a main component, the conductivity of an oxide semiconductor is generated. Accordingly, when the regions containing $In_{X2}Zn_{Y2}O_{Z2}$ or $InO_{X1}$ as a main component are distributed like a cloud in an oxide semiconductor, high field-effect mobility (μ) can be achieved.

By contrast, the insulating property of the region containing $GaO_{X3}$ or the like as a main component is superior to that of the region containing $In_2Zn_{Y2}O_{Z2}$ or $InO_{X1}$ as a main component. In other words, when the regions containing $GaO_{X3}$ or the like as a main component are distributed in an oxide semiconductor, leakage current can be suppressed and a favorable switching operation can be achieved.

Accordingly, when a CAC-OS is used in a semiconductor device, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and a high field-effect mobility (μ) can be achieved.

A semiconductor device using a CAC-OS has high reliability. Thus, the CAC-OS is suitably used as a material in a variety of semiconductor apparatuses.

Figure 4A:
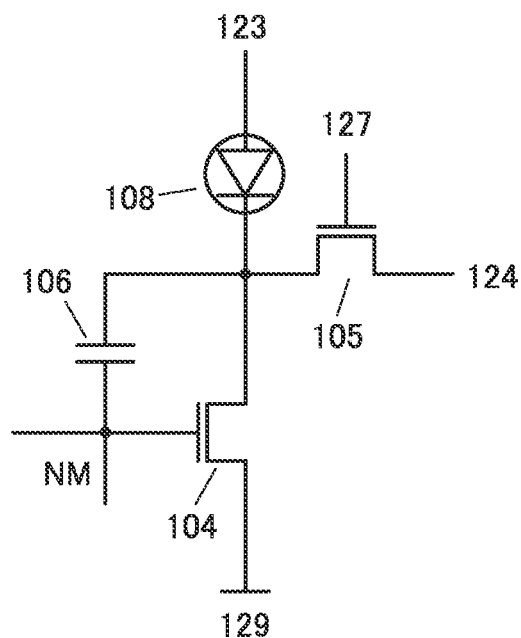
FIG. 4A to FIG. 4C are diagrams illustrating pixel circuits.

Note that the circuit configuration of the pixel illustrated in FIG. 1 is an example, and for example, as illustrated in FIG. 4A, the one electrode of the light-emitting device 108 may be electrically connected to the wiring 123, and the other electrode of the light-emitting device 108 may be electrically connected to the other of the source and the drain of the transistor 104.

Figure 4B:
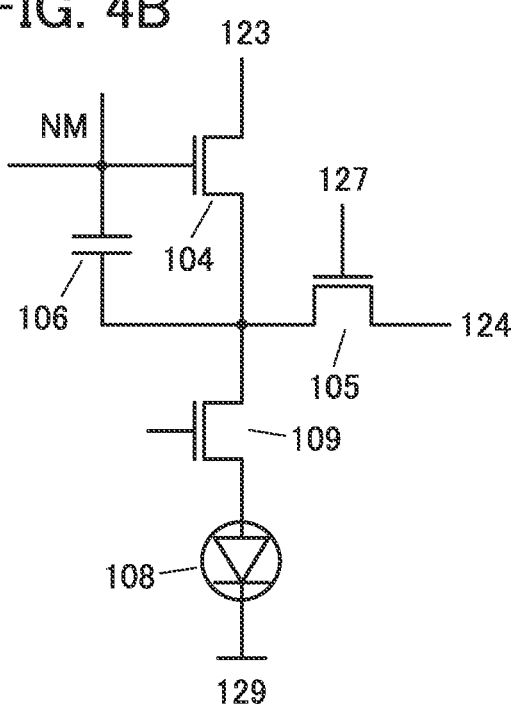

Alternatively, as illustrated in FIG. 4B, a transistor 109 may be provided between the one of the source and the drain of the transistor 104 and the one electrode of the light-emitting device 108 and between the transistor 109. By providing the transistor 109, the timing of light emission can be controlled freely. Alternatively, the configurations illustrated in FIG. 4A and FIG. 4B can be combined.

Figure 4C:
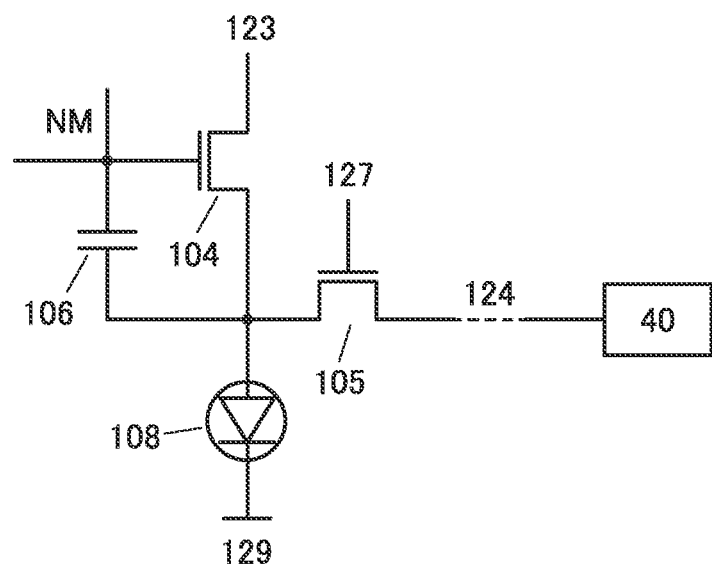

Furthermore, as illustrated in FIG. 4C, a circuit 40 can be electrically connected to the wiring 124 that is connected to the transistor 105. The circuit 40 can have one or more of a function of the supply source of the reference potential ($V_{ref}$), a function of obtaining electrical characteristics of the transistor 104, and a function of generating correction data.

Figure 5:
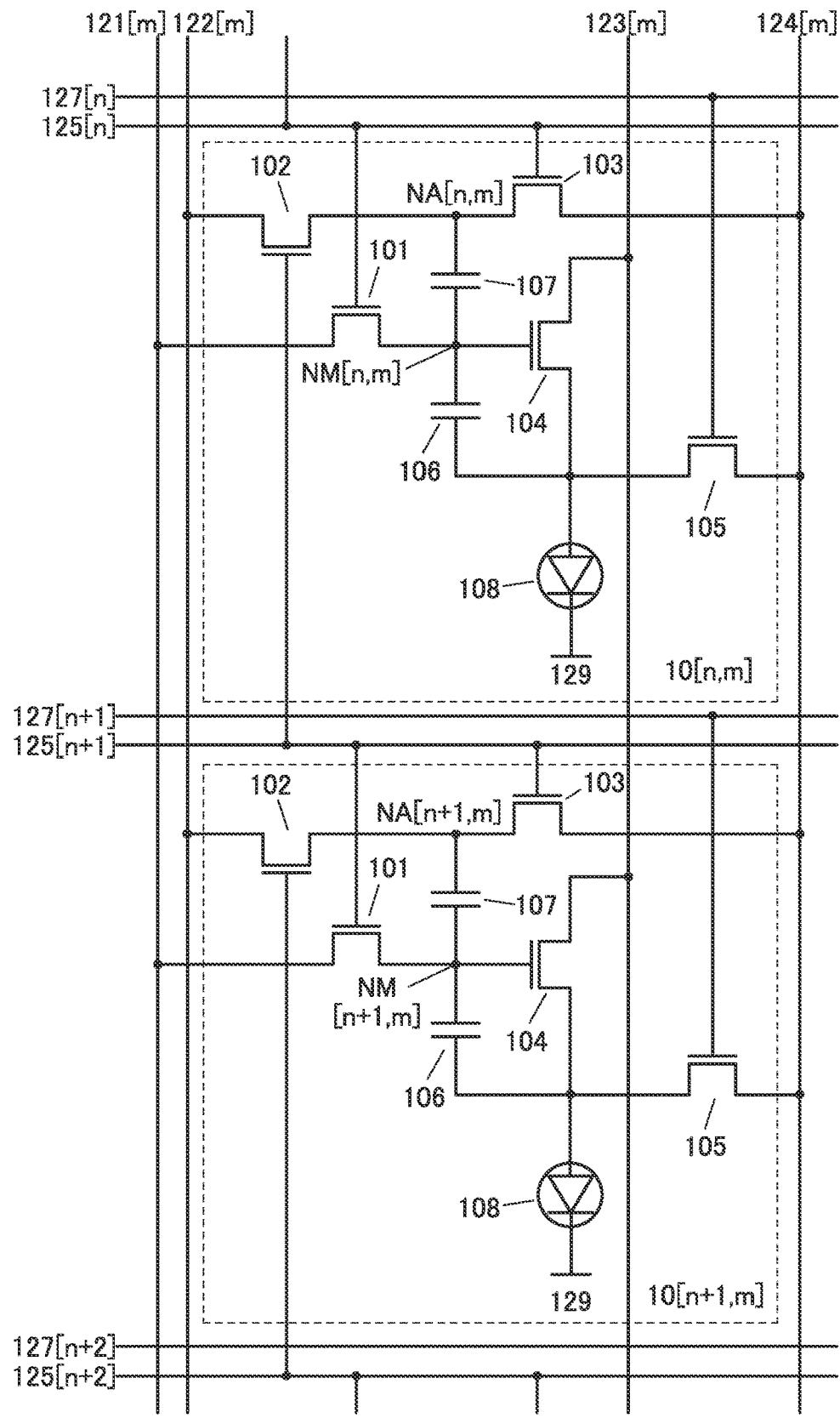
FIG. 5 is a diagram illustrating a pixel circuit.

Furthermore, as illustrated in FIG. 5, two pixels that are adjacent in the vertical direction (the direction in which the source lines (the wirings 121 and 122) extend) may have a common gate line (wiring 125). FIG. 5 is a diagram illustrating a pixel 10[n,m] placed in the n-th row and the m-th column (n and m are each a natural number of greater than or equal to 1) and a pixel 10[n+1,m] placed in the n+1-th row and the m-th column. The basic structure of the pixel 10 is similar to that of the pixel circuit illustrated in FIG. 1; however, the wiring 126 is omitted because the wiring 125 doubles as the wiring 126.

The gate of the transistor 102 of the pixel 10[n,m] is electrically connected to a wiring 125[n+1]. The gate of the transistor 101 and the gate of the transistor 103 of the pixel 10[n+1,m] are electrically connected to the wiring 125[n+1].

The gate of the transistor 102 of the pixel 10[n+1,m] is electrically connected to a wiring 125[n+2]. Although not illustrated, the gate of the transistor 101 and the gate of the transistor 103 of a pixel 10[n+2,m] are electrically connected to the wiring 125[n+2].

In the pixel 10 of one embodiment of the present invention, two writing operations that are the writing of first data (weight) and the writing of second data (data) are performed. Weight and data are supplied from different source lines; thus, the timing of the writing of data in one of the pixels can overlap with the timing of the writing of weight in the other of the pixels. Therefore, the gates of the transistors that perform these operations can be connected to a common gate line.

When a common gate line is shared by two pixels, the number of gate lines for each pixel can be reduced from three to substantially two; thus, the aperture ratio of the pixel can be increased. Furthermore, the gate driver operation is simplified and the number of gate wirings that need the charging and discharging is reduced, so that the power consumption can also be reduced.

Figure 6:
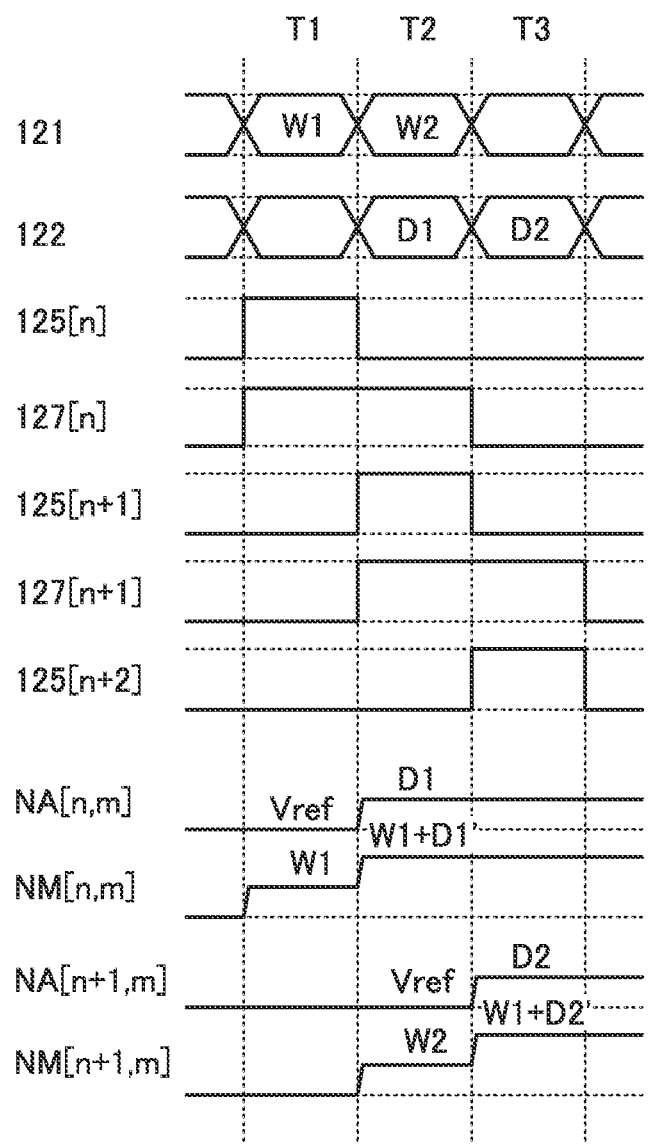
FIG. 6 is a timing chart showing the operation of a pixel circuit.

Next, the operation of the two pixels that are illustrated in FIG. 5 will be described with reference to a timing chart shown in FIG. 6. An example of operation in which a data potential that is approximately twice the data potential output from the source driver is supplied to the display device by the operation of the pixel 10 will be described below.

In the operation description, a high potential is represented by "H" and a low potential is represented by "L". In addition, weight supplied to the pixel 10[n,m] is "W1", image data supplied to the pixel 10[n,m] is "D1", weight supplied to the pixel 10[n+1,m] is "W2", and image data supplied to the pixel 10[n+1,m] is "D2". As "$V_{ref}$", 0 V, a GND potential, or a certain potential can be used, for example.

Furthermore, suppose that the high potential is always supplied to the wiring 123, the low potential is always supplied to the wiring 129, and the reference potential ($V_{ref}$) is always supplied to the wiring 124. Note that there may be a period in which these potentials are not supplied, as long as the operation is not disturbed.

Note that in potential distribution, potential coupling, or potential loss, detailed changes due to a circuit structure, operation timing, or the like are not considered here. A change in potential due to capacitive coupling using a capacitor depends on the capacitance ratio between the capacitor and a component connected thereto; however, for simplicity of the description, the capacitance value of the component is assumed sufficiently small.

In Period T1, "W1" is supplied to the wiring 121.

In Period T1, the potential of the wiring 125[n] is set to "H" and the potential of the wiring 127[n] is set to "H", whereby the transistor 102 is turned on in the pixel 10[n,m], so that the potential of a node NA[n,m] becomes "$V_{ref}$". This operation is a reset operation for an addition operation (capacitive coupling operation) to be performed later.

In addition, the transistor 101 is turned on, and the potential of the wiring 121[m] is written to a node NM[n,m]. Moreover, the transistor 105 is turned on, whereby the source potential of the transistor 104 becomes "$V_{ref}$". This operation is an operation of writing weight in the pixel 10[n,m], and a potential "W1" is written to the node NM[n, m] in a state where the source potential of the transistor 104 is stable.

In Period T2, "W2" is supplied to the wiring 121 and "D1" is supplied to the wiring 122.

In Period T2, the potential of the wiring 125[n] is set to "L", the potential of the wiring 127[n] is set to "H", the potential of the wiring 125[n+1] is set to "H", and the potential of a wiring 127[n+1] is set to "H", whereby the transistor 101 is turned off. At this time, "W1" is retained in the node NM[n,m]. In addition, "W1–$V_{ref}$" is retained in the capacitor 107.

Furthermore, the transistor 103 is turned off and the transistor 102 is turned on, whereby the potential of the node NA[n,m] becomes "D1", the potential of the wiring 122[m]. At this time, the change of the node NA "D1–$V_{ref}$" is added to the node NM[n,m] in accordance with the capacitance ratio between the capacitor 107 and the node NM[n,m]. This operation is an addition operation in the pixel 10[n,m], and the potential of the node NM[n,m] becomes "W1+(D1–$V_{ref}$)". At this time, when "$V_{ref}$"=0, the potential of the node NM[n,m] becomes "W1+D1".

Moreover, in the pixel 10[n+1,m], the transistor 102 is turned on, whereby the potential of a node NA[n+1,m] becomes "$V_{ref}$". This operation is a reset operation for an addition operation (capacitive coupling operation) to be performed later.

In addition, the transistor 101 is turned on, and the potential of the wiring 121[m] is written to a node NM[n+1,m]. Moreover, the transistor 105 is turned on, whereby the source potential of the transistor 104 becomes "$V_{ref}$". This operation is an operation of writing weight in the pixel 10[n+1,m], and a potential "W2" is written to the node NM[n+1,m] in a state where the source potential of the transistor 104 is stable.

In Period T3, "D2" is supplied to the wiring 122.

In Period T3, the potential of the wiring 127[n] is set to "L", the potential of the wiring 125[n+1] is set to "L", the potential of the wiring 127[n+1] is set to "H", and the potential of the wiring 125[n+2] is set to "H", whereby in the pixel 10[n,m], the transistor 105 is turned off, and current flows through the transistor 104 in accordance with the potential of the node NM[n,m], so that the light-emitting device 108 emits light.

Furthermore, in the pixel 10[n+1,m], the transistor 103 is turned off and the transistor 102 is turned on, whereby the potential of the node NA[n+1,m] becomes "D2", the potential of the wiring 122[m]. At this time, the change of the node NA "D2–$V_{ref}$" is added to the node NM[n+1,m] in accordance with the capacitance ratio between the capacitor 107 and the node NM[n+1,m]. This operation is an addition operation in the pixel 10[n+1,m], and the potential of the node NM[n+1,m] becomes "W2+(D2–$V_{ref}$)". At this time, when "$V_{ref}$"=0, the potential of the node NM[n+1,m] becomes "W2–D2".

Then, the potential of the wiring 127[n+1] is set to "L" and the potential of the wiring 125[n+2] is set to "L", whereby in the pixel 10[n+1,m], the transistor 105 is turned off, and current flows through the transistor 104 in accordance with the potential of the node NM[n+1,m], so that the light-emitting device 108 emits light.

In the above operation, in the case where W1=D1 or W2=D2 and the capacitance of the node NM is sufficiently smaller than the capacitance of the capacitor 107, "W1+D1" becomes a value close to "2D1" and "W2+D2" becomes a value close to "2D2". Thus, a data potential approximately twice the data potential output from the source driver can be supplied to the display device.

Figure 7A:
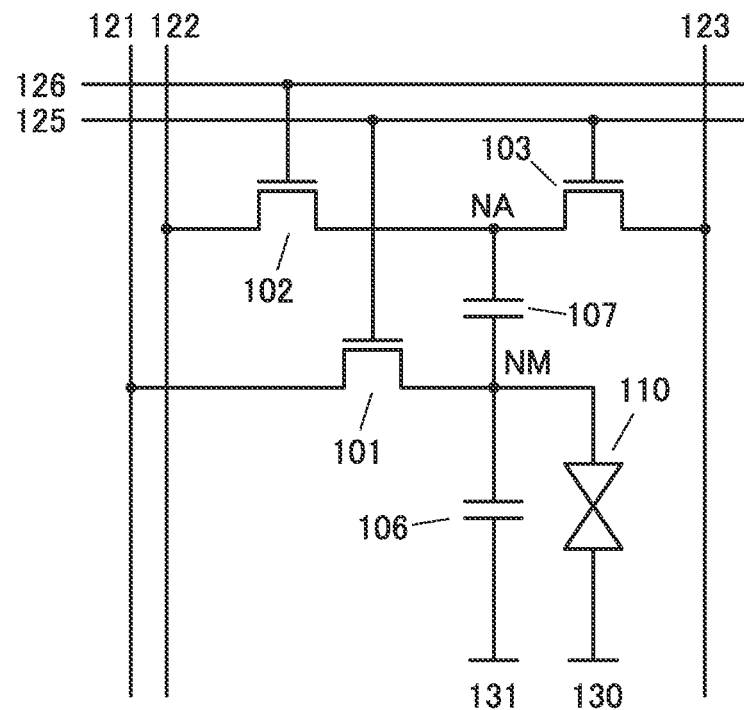
FIG. 7A is a diagram illustrating a pixel circuit.

Although an example in which a light-emitting device is used as a display device is described above, a liquid crystal device (also referred to as a liquid crystal element) may also be used. FIG. 7A is a circuit diagram of the pixel using a liquid crystal device as a display device. One electrode of a liquid crystal device 110 is electrically connected to the node NM, and the other electrode of the liquid crystal device 110 is electrically connected to a wiring 130. Furthermore, the other electrode of the capacitor 106 is electrically connected to a wiring 131. Note that the components that are the same as those in the pixel illustrated in FIG. 1 are denoted by the same reference numerals, and the description thereof is omitted.

Figure 7B:
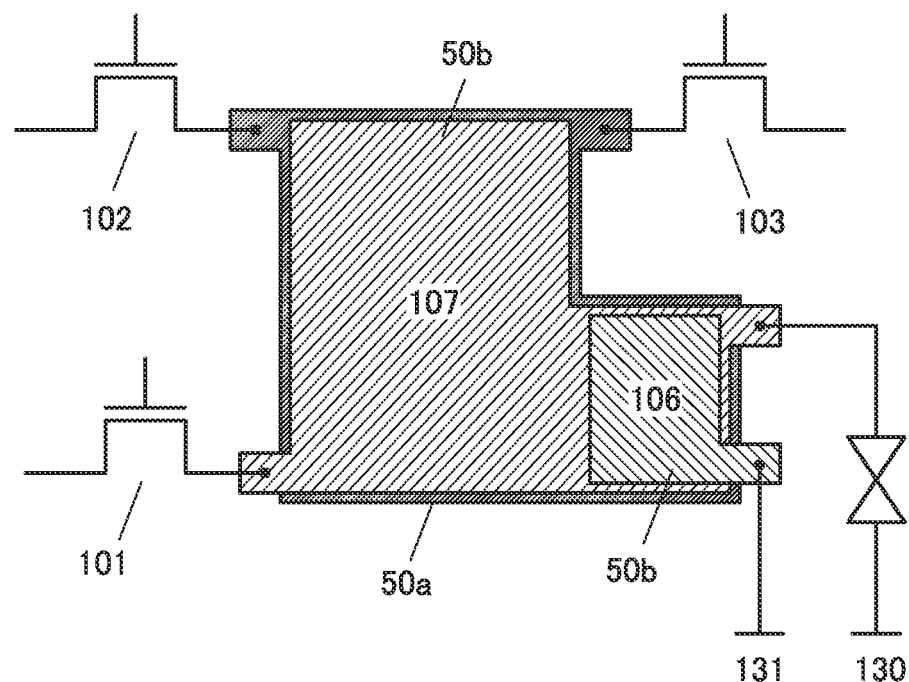
FIG. 7B is a diagram illustrating structures of capacitors.

FIG. 7B is a top view illustrating a simple layout of the capacitor 106 and the capacitor 107. The capacitor 106 and the capacitor 107 can have the same structures as those illustrated in FIG. 3A and FIG. 3B.

The wiring 130 and the wiring 131 may be electrically connected to each other. The wirings 130 and 131 have a function of supplying power. The wirings 130 and 131 are capable of supplying a reference potential such as GND or 0 V or a given potential, for example.

Figure 8A:
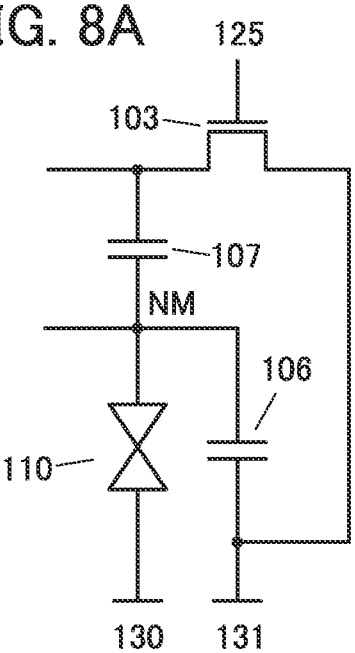
FIG. 8A and FIG. 8B are diagrams illustrating pixel circuits.

The other of the source and the drain of the transistor 103 is electrically connected to the wiring 123; however, the other of the source and the drain of the transistor 103 may be electrically connected to the wiring 131, as illustrated in FIG. 8A. Alternatively, the other of the source and the drain of the transistor 103 may be electrically connected to the wiring 130. Alternatively, the other electrode of the capacitor 106 may be electrically connected to the wiring 123.

Figure 8B:
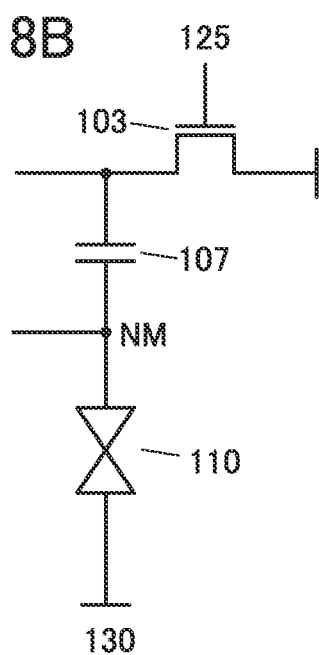

As illustrated in FIG. 8B, it is also possible to omit the capacitor 106. As described above, an OS transistor can be used as the transistor connected to the node NM. Since an OS transistor has extremely low leakage current, an image can be displayed for a relatively long time even when the capacitor 106 functioning as a storage capacitor is omitted. In addition, regardless of the transistor structure, omitting the capacitor 106 is effective in the case where a high-speed operation allows a shorter display period as in field-sequential driving. The aperture ratio can be improved by omitting the capacitor 106. Alternatively, the transmittance of the pixel can be improved.

Figure 9:
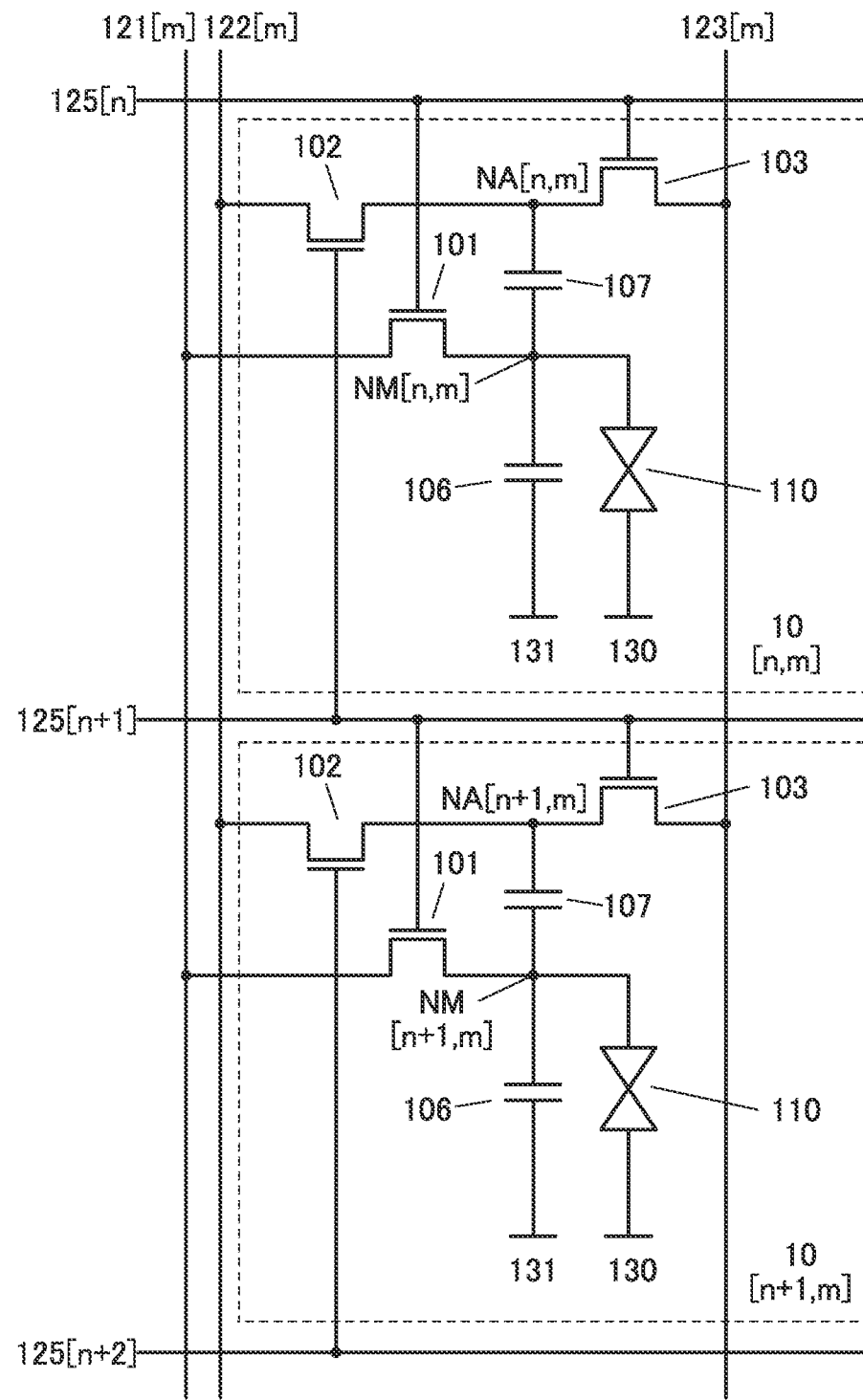
FIG. 9 is a diagram illustrating a pixel circuit.

Moreover, even in the case where a liquid crystal device is used, a common gate line can be shared by two pixels aligned in the vertical direction. As illustrated in FIG. 9, in the case where a liquid crystal device is used, when the gate line is shared by the two pixels, the number of gate lines for each pixel can be reduced from two to substantially one. The operation of the case where a light-emitting device is used can be referred to for the description of the operation of adding a potential in the node NM.

Figure 10:
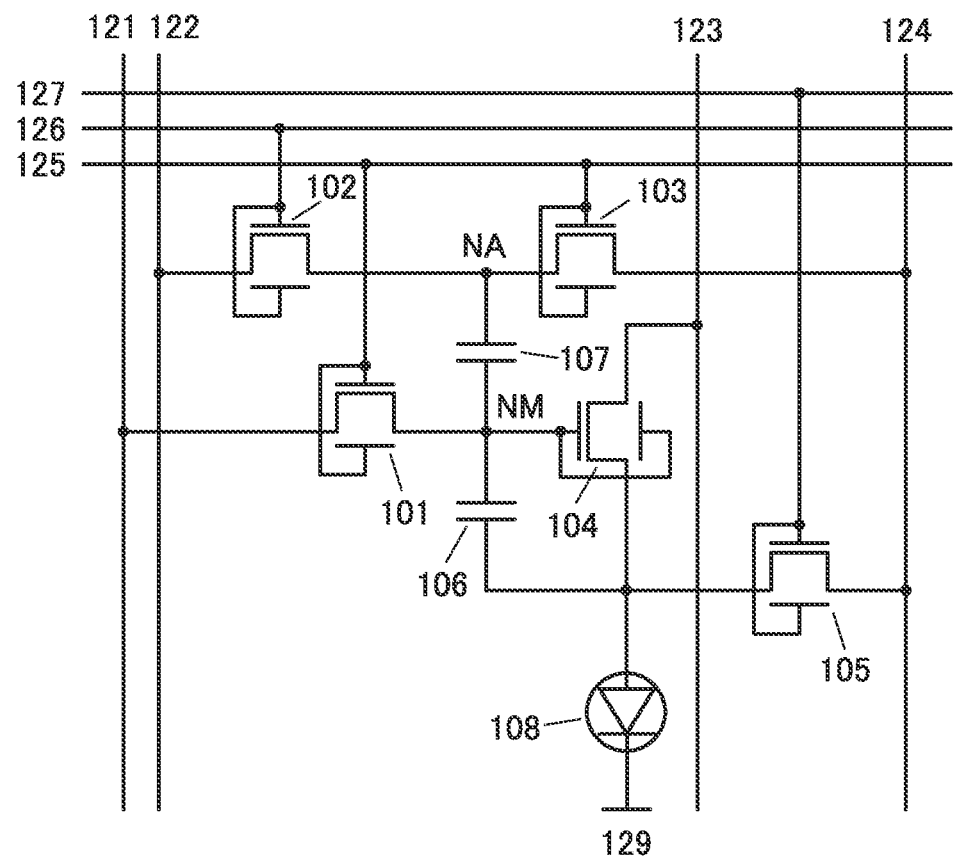
FIG. 10 is a diagram illustrating a pixel circuit.

In the pixel of one embodiment of the present invention, as illustrated in FIG. 10, a configuration in which transistors are provided with back gates may be employed. FIG. 10 illustrates a configuration in which back gates are electrically connected to front gates, which has an effect of increasing on-state current. Alternatively, a configuration in which the back gates are electrically connected to wirings capable of supplying a constant potential may be employed. This configuration enables control of the threshold voltages of the transistors.

Figure 11:
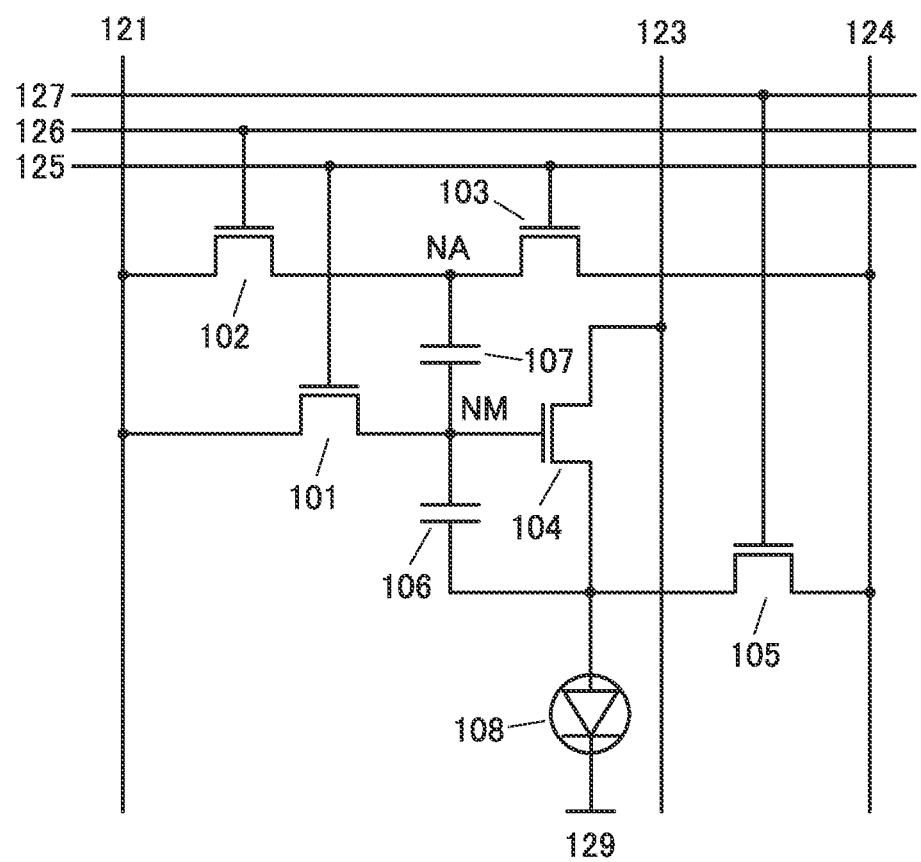
FIG. 11 is a diagram illustrating a pixel circuit.

Moreover, in the pixel of one embodiment of the present invention, a configuration in which one source line is provided may be employed, as illustrated in FIG. 11. Since weight and data are written at different timings in the pixel, a common source line can be used to supply them. However, this configuration cannot be combined with the configuration in which a gate line is shared by two pixels illustrated in FIG. 5 or FIG. 9.

Next, layout examples of the pixel including the light-emitting device illustrated in FIG. 1 will be described in detail with reference to FIG. 12A, FIG. 12B, FIG. 13A, FIG. 13B, FIG. 14A, FIG. 14B, and FIG. 15A to FIG. 15C. Note that the capacitor structure will be mainly described; thus, the light-emitting device and some of the components included in the pixel are not illustrated in FIG. 12A, FIG. 12B, FIG. 13A, FIG. 13B, FIG. 14A, FIG. 14B, and FIG. 15A to FIG. 15C, and the description thereof will be omitted. Note that the same reference numerals as those in FIG. 1, FIG. 3A, and FIG. 3B are used in FIG. 12A, FIG. 12B, FIG. 13A, FIG. 13B, FIG. 14A, FIG. 14B, and FIG. 15A to FIG. 15C.

Figure 12A:
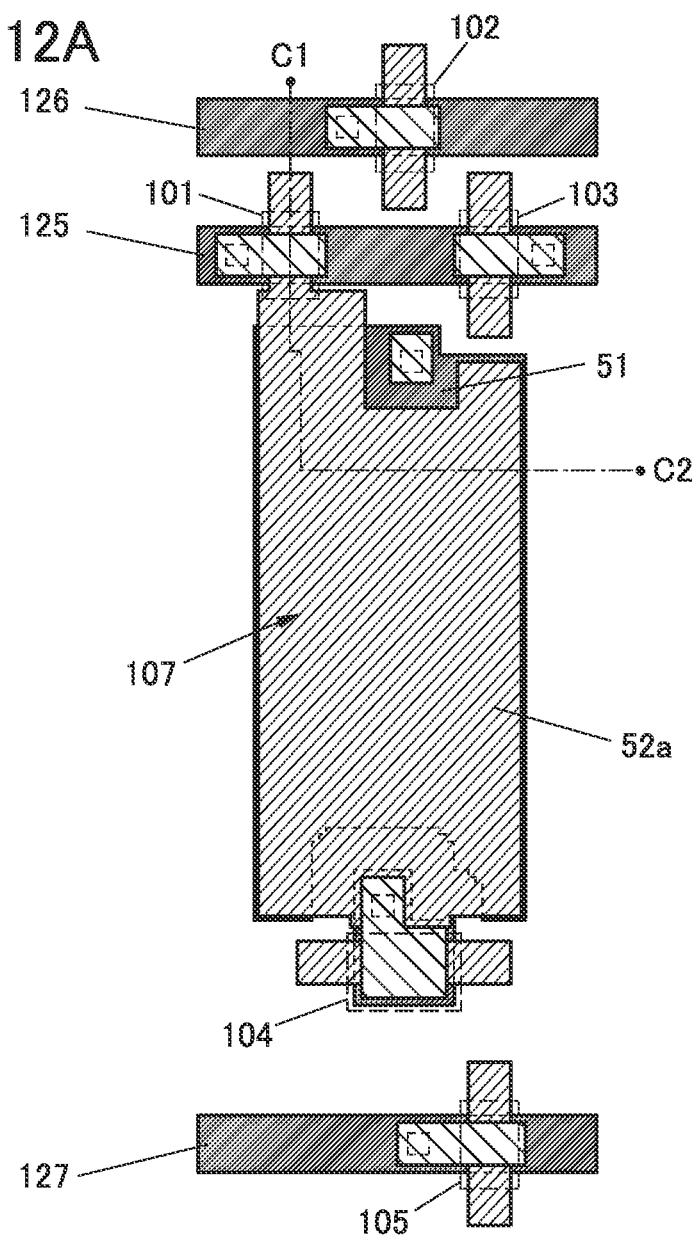
FIG. 12A and FIG. 12B are diagrams illustrating a pixel layout.
Figure 12B:
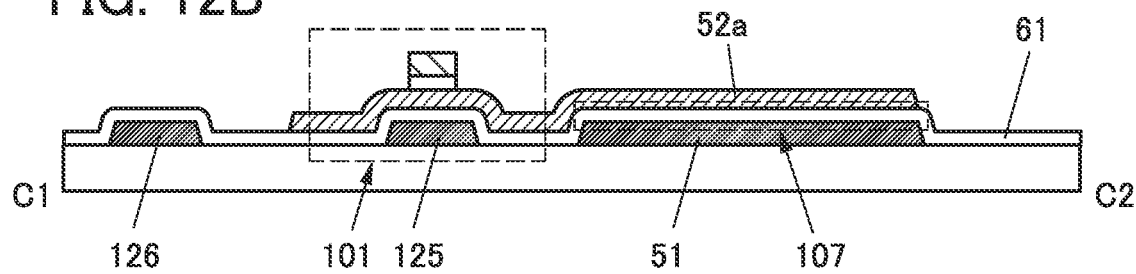

FIG. 12A and FIG. 12B are diagrams illustrating a stack state of the conductive layer 51, the dielectric layer 61, and a conductive layer 52a, which make up the capacitor 107. FIG. 12A is the top view. FIG. 12B is a cross-sectional view taken along a dashed-dotted line C1-C2 in FIG. 12A.

The conductive layer 51 can be formed in the same process as those of the wiring 125, the wiring 126, the wiring 127, and a back gate electrode of the transistor 104. The wiring 125 also functions as a back gate electrode of the transistor 101. The wiring 126 also functions as a back gate electrode of the transistor 102 and the transistor 103. The wiring 127 also functions as a back gate electrode of the transistor 105. A low-resistance metal layer or the like, for example, can be used as the conductive layer 51.

The dielectric layer 61 can be formed in the same process as those of back gate insulating films of the transistors 101 to 105. An inorganic insulating layer such as a silicon oxide film can be used as the dielectric layer 61.

The conductive layer 52a is a low-resistance semiconductor layer, which is formed in the following manner: a semiconductor layer is formed, and then, an impurity or the like is introduced to lower the resistance of the semiconductor layer. The semiconductor layer can be formed by using the same process as those of semiconductor layers of the transistors 101 to 105.

In the transistor, the region where the impurity is introduced can be controlled by using the gate electrode as a mask; a region overlapping with the gate electrode becomes a high-resistance region, and the other region becomes a low-resistance region. The high-resistance region serves as a channel formation region, and the low-resistance region serves as a source region or a drain region. The low-resistance region can be, for example, an oxide conductive layer obtained by lowering the resistance of an oxide semiconductor such as IGZO. The conductive layer 52a can be formed in a manner similar to that of the low-resistance region.

In the above manner, the capacitor 107 can be formed.

Figure 13A:
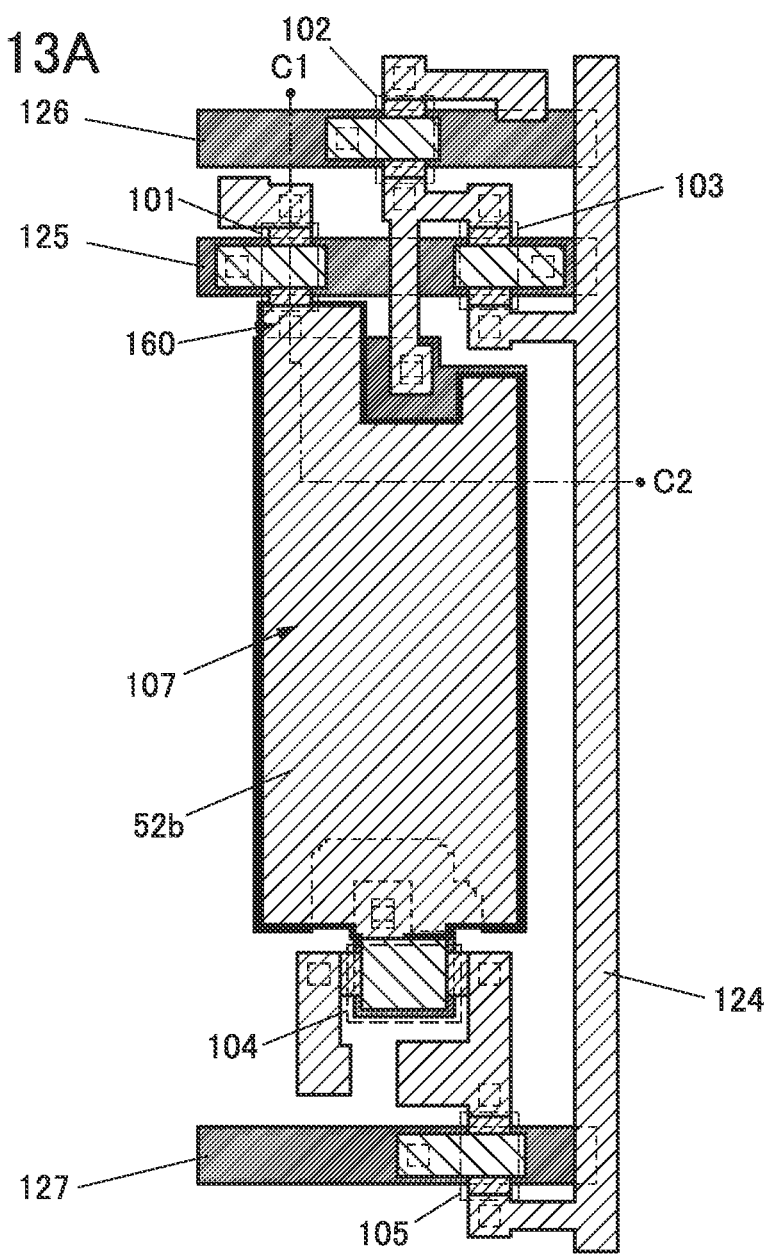
FIG. 13A and FIG. 13B are diagrams illustrating a pixel layout.
Figure 13B:
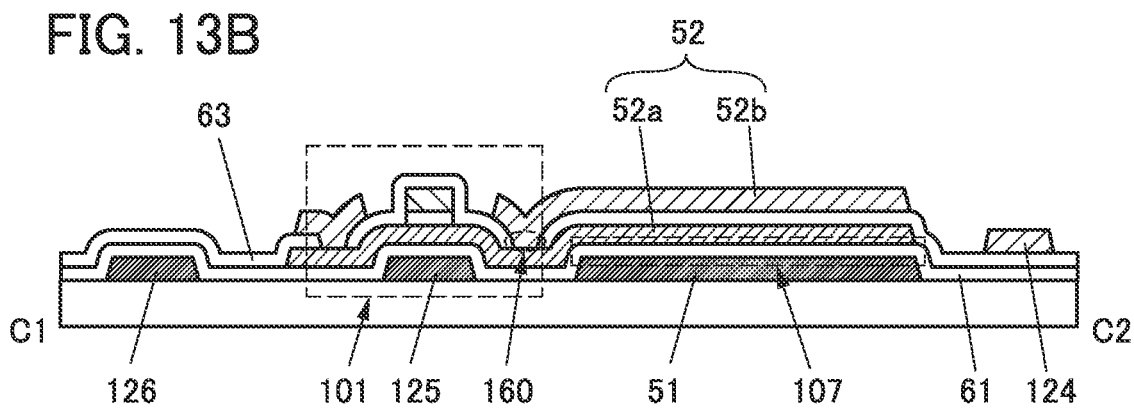

Next, a conductive layer 52b functioning as an electrode of the capacitor 106 will be described with reference to FIG. 13A and FIG. 13B. FIG. 13A is the top view. FIG. 13B is a cross-sectional view taken along a dashed-dotted line C1-C2 in FIG. 13A.

The conductive layer 52b has a region overlapping with the conductive layer 52a. In addition, the conductive layer 52b is electrically in direct contact with the conductive layer 52a, and thus the conductive layer 52b and the conductive layer 52a have the same potential. Hence, the conductive layer 52b and the conductive layer 52a can be regarded as the same as the conductive layer 52 illustrated in FIG. 3B.

A protective layer 63 is provided over the transistors and the conductive layer 52a. An inorganic insulating layer such as a silicon oxide film, for example, can be used as the protective layer 63.

The conductive layer 52a is an extended region of the one of the source and the drain of the transistor 101. An opening 160 is provided in the protective layer 63 overlapping with the one of the source and the drain of the transistor 101. The conductive layer 52b is formed to have a region overlapping with the conductive layer 52a with the protective layer 63 therebetween. Furthermore, a portion of the conductive layer 52b is provided in the opening 160 and is electrically in direct contact with the conductive layer 52a.

The conductive layer 52b can be formed in the same process as those of the wiring 124, a connection wiring that corresponds to the source electrode or the drain electrode of each transistor, and the like. A low-resistance metal layer or the like, for example, can be used as the conductive layer 52b.

Figure 14A:
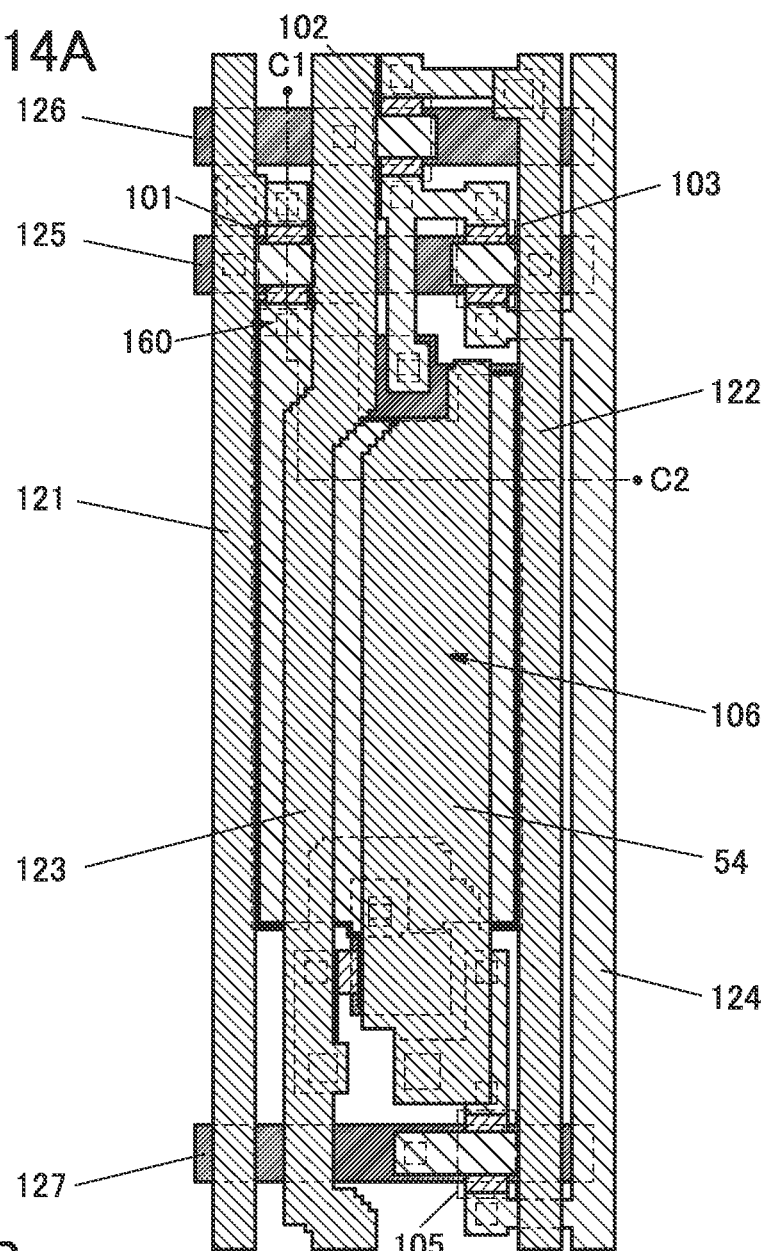
FIG. 14A and FIG. 14B are diagrams illustrating a pixel layout.
Figure 14B:
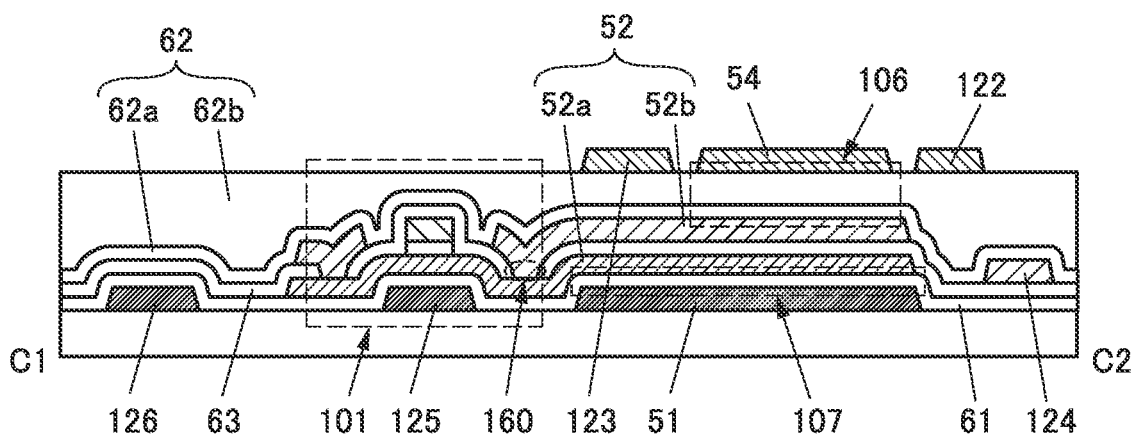

Next, the structure of the capacitor 106 will be described with reference to FIG. 14A and FIG. 14B. FIG. 14A is a top view. FIG. 14B is a cross-sectional view taken along a dashed-dotted line C1-C2 in FIG. 14A. The capacitor 106 has a structure in which the conductive layer 52b, a dielectric layer 62a, a dielectric layer 62b, and the conductive layer 54 are stacked.

The dielectric layer 62a is provided over the transistors and the conductive layer 52b. An inorganic insulating layer such as a silicon oxide film or a silicon nitride film, for example, can be used as the dielectric layer 62a. The dielectric layer 62a also functions as a protective film of the transistor.

The dielectric layer 62b is provided over the dielectric layer 62a. An organic insulating layer of acrylic, polyimide, or the like, for example, can be used as the dielectric layer 62b. The dielectric layer 62b also functions as a planarization film. The dielectric layer 62a and the dielectric layer 62b both function as dielectric layers of the capacitor 106. In other words, the dielectric layer 62a and the dielectric layer 62b can be regarded as the same as the dielectric layer 62 illustrated in FIG. 3B.

The conductive layer 54 is provided over the dielectric layer 62b to have a region overlapping with the conductive layer 52b. The conductive layer 54 can be formed in the same process as those of the wiring 122 and the wiring 123. A low-resistance metal layer or the like, for example, can be used as the conductive layer 54.

In the above manner, a configuration can be obtained in which the capacitor 107 and the capacitor 106 have a region where they overlap with each other, with the conductive layer 52 serving as a common electrode.

Figure 15A:
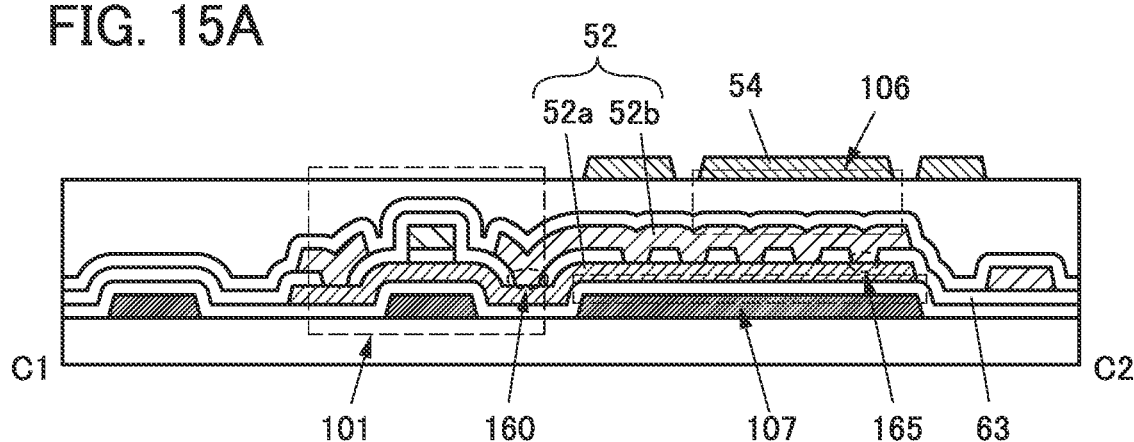
FIG. 15A to FIG. 15C are diagrams illustrating pixel layouts.

Note that the conductive layer 52a, which is formed by lowering the resistance of a semiconductor layer, is higher in resistance than a metal layer. Thus, the area in which the conductive layer 52a and the conductive layer 52b are in contact with each other may be increased by providing a plurality of openings 165 in the protective layer 63, as illustrated in FIG. 15A, to mitigate the effect of resistance. This configuration can be rephrased as a configuration with a plurality of openings 160.

Figure 15B:
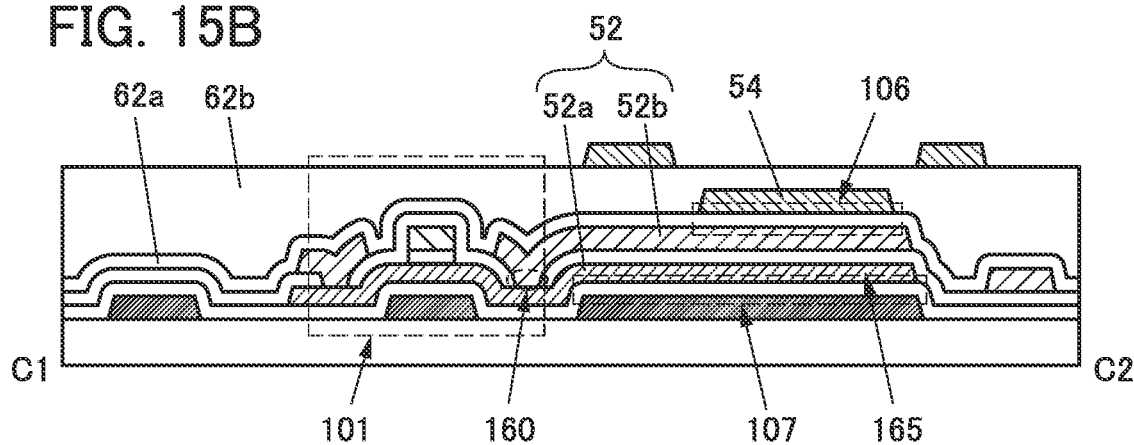

Since the structure of the capacitor 106 illustrated in FIG. 14A and FIG. 14B includes relatively thick organic insulating layers as the dielectric layers, it is difficult to increase the capacitance value in some cases. Thus, the conductive layer 54 may be provided in contact with the dielectric layer 62a, as illustrated in FIG. 15B. In this configuration, the organic insulating layer (the dielectric layer 62b) is provided over the dielectric layer 62a and the conductive layer 54.

Figure 15C:
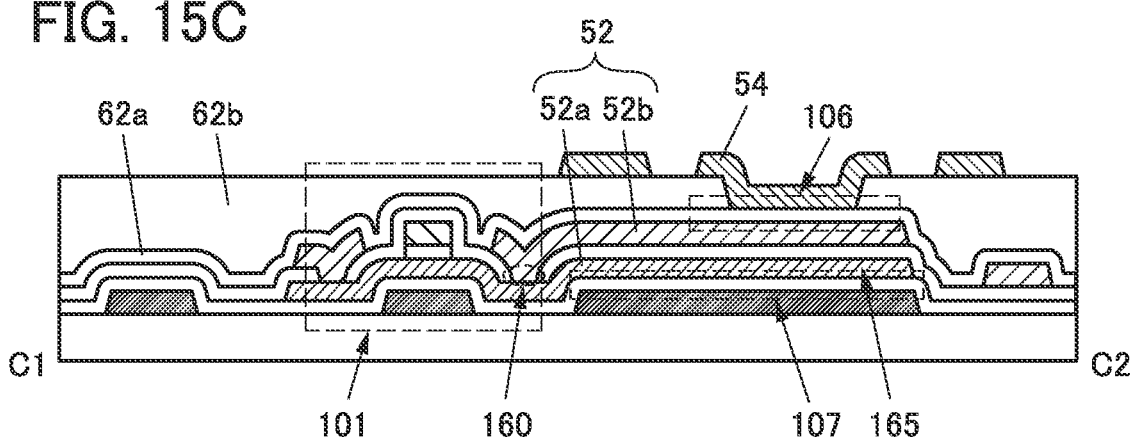

Alternatively, an opening may be provided in a region of the organic insulating layer (the dielectric layer 62b) overlapping with the conductive layer 52b, and the conductive layer 54 may be provided in the opening, as illustrated in FIG. 15C. In the configurations illustrated in FIG. 15B and FIG. 15C, the dielectric layer can be formed using one layer, the inorganic insulating layer (the dielectric layer 62a); thus, the capacitive value is easily increased.

Although examples in which two different capacitors have a region where they overlap with each other are described above, a configuration in which three capacitors are provided and one capacitor has a region overlapping with the other two capacitors may also be employed. In the case where the pixel circuit includes two capacitors, the one capacitor can be connected in parallel with the other one capacitor.

The above-mentioned configuration will be described with reference to FIG. 16A, FIG. 16B, FIG. 17A, FIG. 17B, FIG. 18A, and FIG. 18B. Here, an example is described in which the capacitor 107, a capacitor 106a, and a capacitor 106b are provided in a pixel and the capacitor 106a and the capacitor 106b are connected in parallel to be used as the capacitor 106. Note that the capacitor 107 may also be connected in parallel. The components that are the same as those in FIG. 12A, FIG. 12B, FIG. 13A, FIG. 13B, FIG. 14A, FIG. 14B, and FIG. 15A to FIG. 15C will not be described in detail.

Figure 16A:
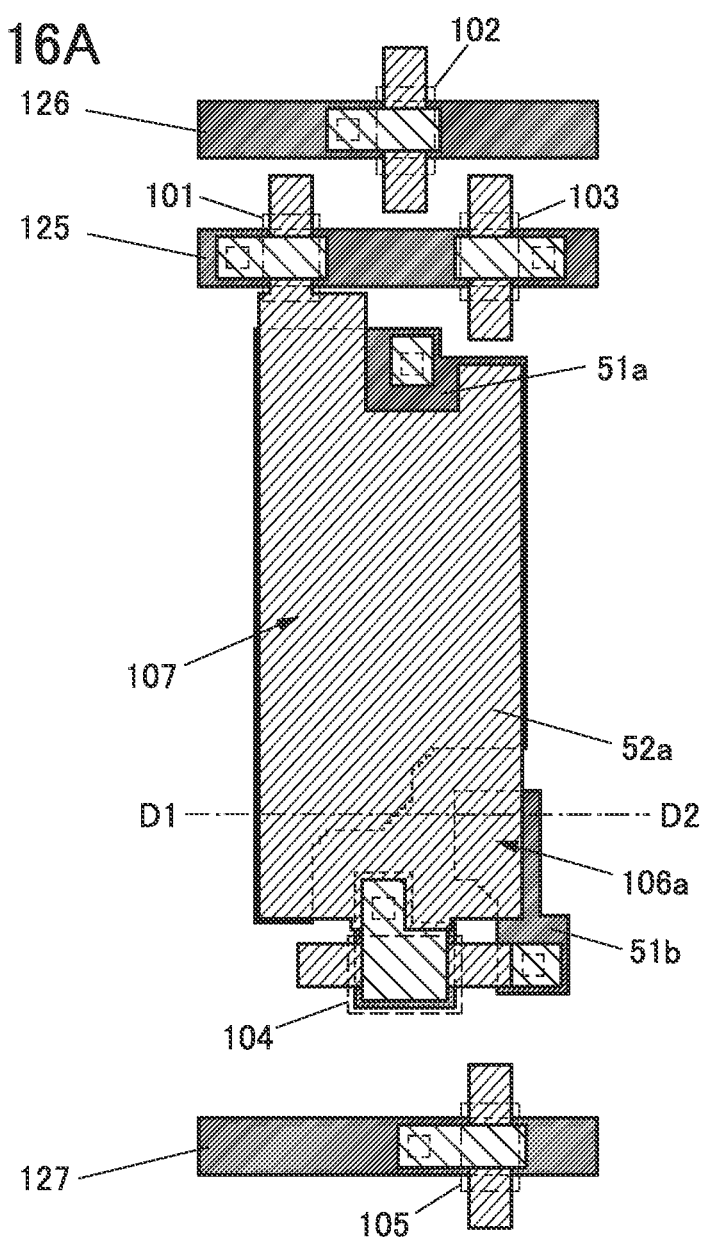
FIG. 16A and FIG. 16B are diagrams illustrating a pixel layout.
Figure 16B:
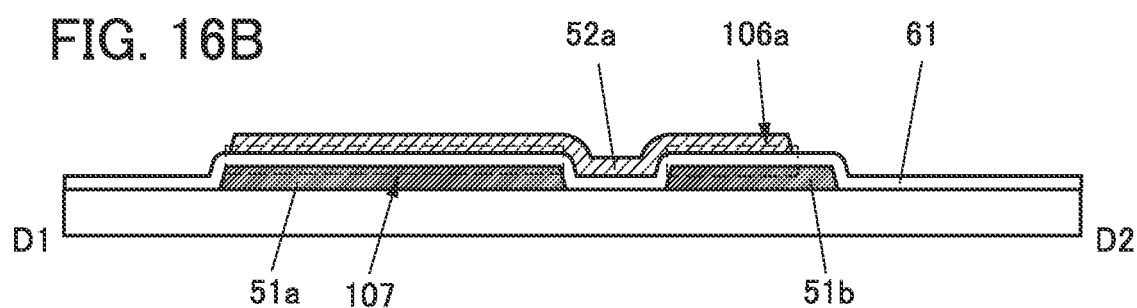

FIG. 16A and FIG. 16B are diagrams illustrating a stack state of a conductive layer 51a, the dielectric layer 61, and the conductive layer 52a, which make up the capacitor 107, and a stack state of a conductive layer 51b, the dielectric layer 61, and the conductive layer 52a, which make up the capacitor 106a. FIG. 16A is a top view. FIG. 16B is a cross-sectional view taken along a dashed-dotted line D1-D2 in FIG. 16A.

The conductive layer 51a and the conductive layer 51b can be formed in the same process as those of the wiring 125, the wiring 126, the wiring 127, and the back gate electrode of the transistor 104. The conductive layer 51a and the conductive layer 51b are provided on the same plane but separately from each other.

The dielectric layer 61 can be formed in the same process as those of the back gate insulating films of the transistors 101 to 105.

The conductive layer 52a can be formed by using the same process as those of the semiconductor layers of the transistors 101 to 105 and the process of lowering the resistance of the semiconductor layer. An oxide conductive layer obtained by lowering the resistance of an oxide semiconductor such as IGZO, for example, can be used as the conductive layer 52a.

Through the above manner, the capacitor 107 and the capacitor 106a with the conductive layer 52a as a common electrode can be formed.

Figure 17A:
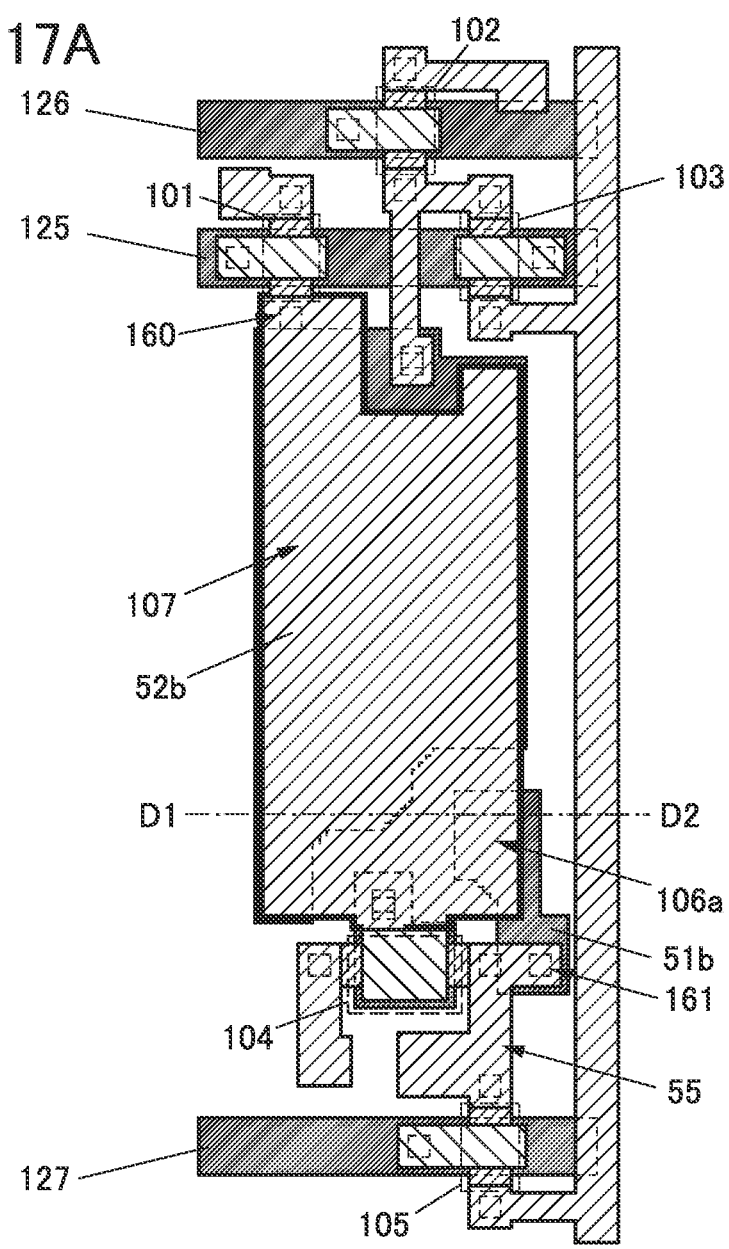
FIG. 17A and FIG. 17B are diagrams illustrating a pixel layout.
Figure 17B:
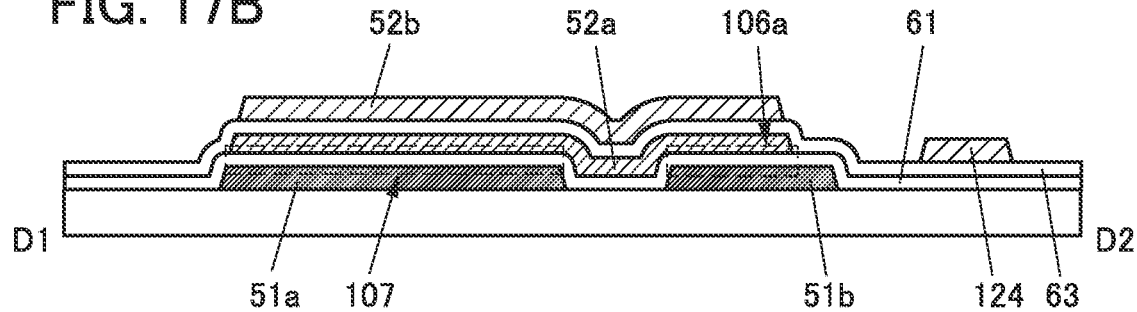

Next, the conductive layer 52b functioning as an electrode of the capacitor 106b will be described with reference to FIG. 17A and FIG. 17B. FIG. 17A is a top view. FIG. 17B is a cross-sectional view taken along a dashed-dotted line D1-D2 in FIG. 17A.

The conductive layer 52b has a region overlapping with the conductive layer 52a. In addition, the conductive layer 52b is electrically in direct contact with the conductive layer 52a in the opening 160 (see FIG. 17A), and thus the conductive layer 52b and the conductive layer 52a have the same potential.

The conductive layer 51b is electrically connected to a connection wiring 55, which is formed in the same process as that of the conductive layer 52b, in an opening 161 provided in the dielectric layer 61 and the protective layer 63 (see FIG. 17A). Note that the connection wiring 55 is electrically connected to the transistor 104 and the transistor 105.

Figure 18A:
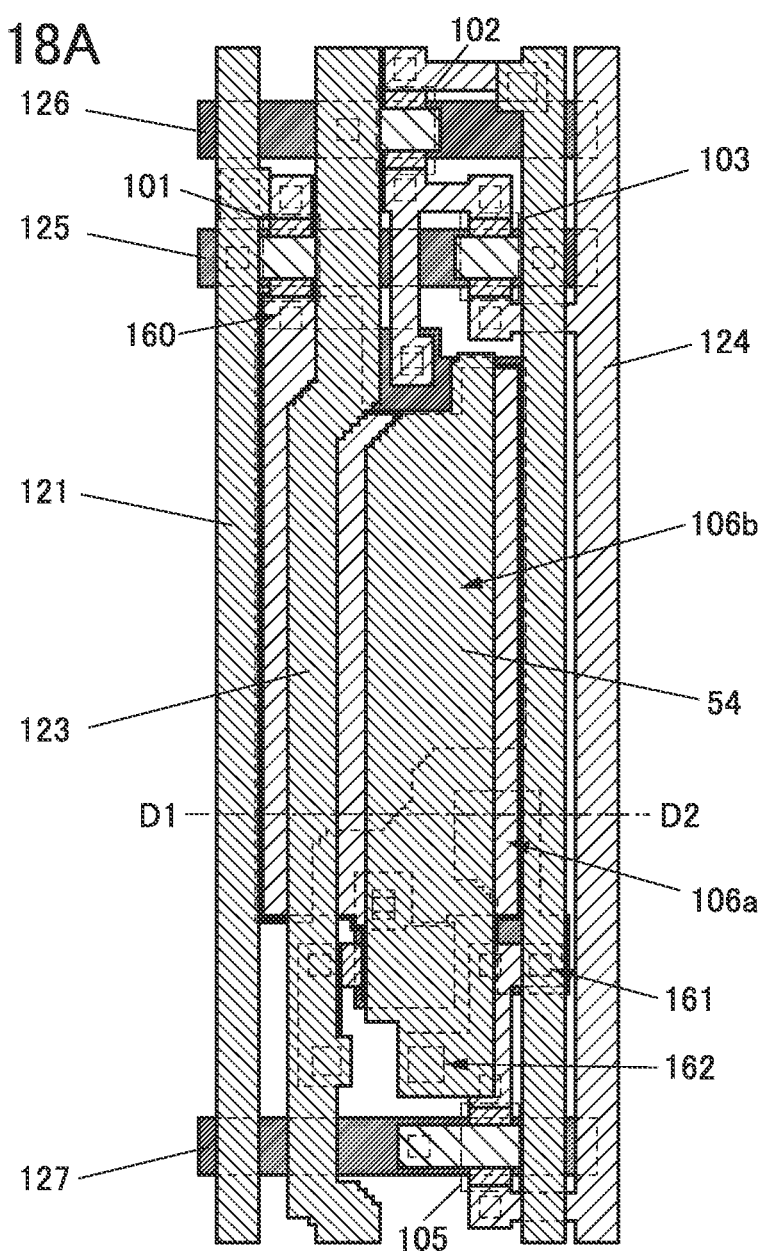
FIG. 18A and FIG. 18B are diagrams illustrating a pixel layout.
Figure 18B:
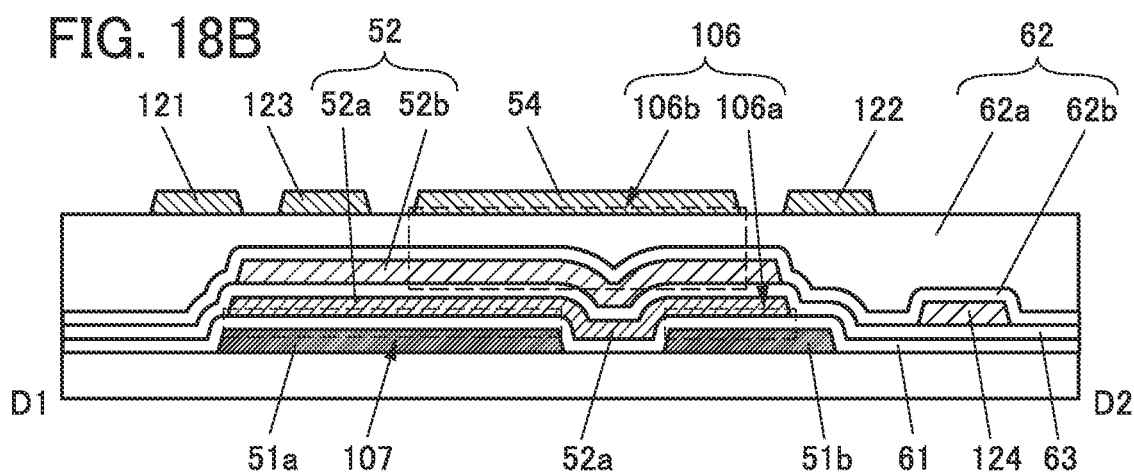

Next, the capacitor 106b will be described with reference to FIG. 18A and FIG. 18B. FIG. 18A is a top view. FIG. 18B is a cross-sectional view taken along a dashed-dotted line D1-D2 in FIG. 18A. The capacitor 106b has a structure in which the conductive layer 52b, the dielectric layer 62a, the dielectric layer 62b, and the conductive layer 54 are stacked.

The dielectric layer 62a is provided over the transistors and the conductive layer 52b. The dielectric layer 62b is provided over the dielectric layer 62a. The dielectric layer 62a and the dielectric layer 62b both function as dielectric layers of the capacitor 106b.

The conductive layer 54 is provided over the dielectric layer 62b to have a region overlapping with the conductive layer 52b.

In the above manner, the capacitor 107, the capacitor 106a, and the capacitor 106b with the conductive layer 52 as a common electrode are formed. Note that the conductive layer 54 is electrically in direct contact with the connection wiring 55 in an opening 162 provided in the dielectric layer 62a and the dielectric layer 62b (see FIG. 18A). Thus, the conductive layer 54 has the same potential as the conductive layer 51b. In other words, the capacitor 106a and the capacitor 106b are connected in parallel, and can function as the capacitor 106.

Note that the configurations illustrated in FIG. 15A to FIG. 15C can be used in the configuration illustrated in FIG. 18A and FIG. 18B.

Figure 19:
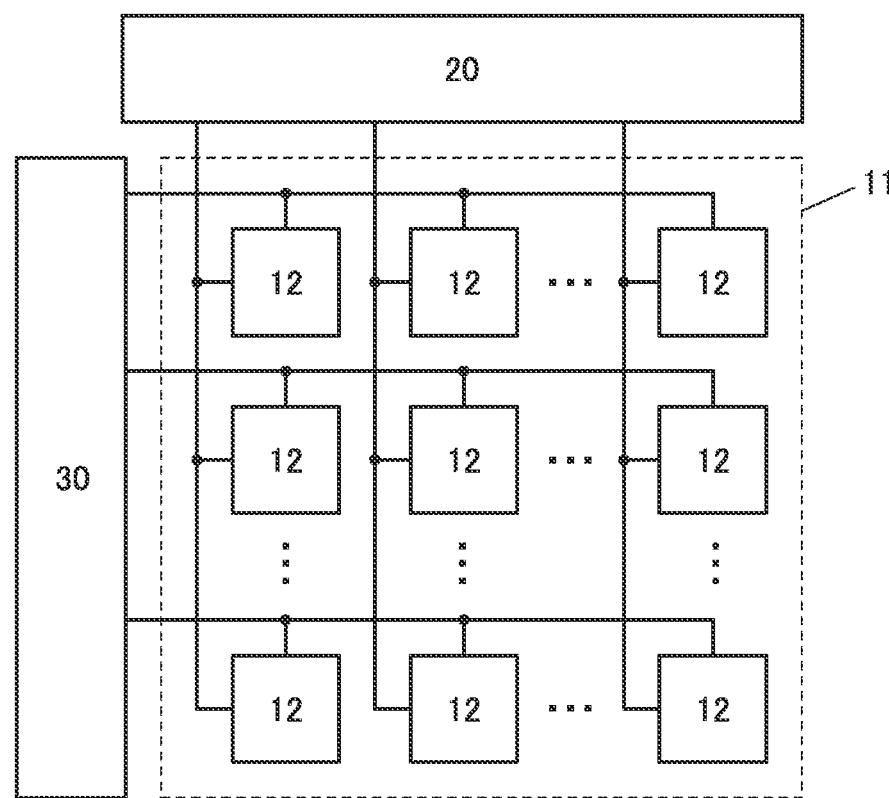
FIG. 19 is a diagram illustrating a display apparatus.

FIG. 19 is a diagram illustrating a display apparatus of one embodiment of the present invention. The display apparatus includes a pixel array 11, a source driver 20, and a gate driver 30. The pixel array 11 includes pixels 12 arranged in the column direction and the row direction. As the pixel 12, a pixel including capacitors with the stack structures described in this embodiment and having a boosting function can be used. Note that wirings are illustrated in a simplified way in the drawing, and the wirings connected to components of the above-described pixel of one embodiment of the present invention are provided.

A sequential circuit such as a shift register can be used for the source driver 20 and the gate driver 30.

Note that for the source driver 20 and the gate driver 30, a method in which an IC chip is attached externally by a COF (chip on film) method, a COG (chip on glass) method, a TCP (tape carrier package) method, or the like can be used. Alternatively, the source driver 20 and the gate driver 30 may be formed on the same substrate as that of the pixel array 11, using transistors manufactured using the same process as that of the pixel array 11.

Although an example in which the gate driver 30 is placed on one side of the pixel array 11 is shown, two gate drivers 30 may be placed with the pixel array 11 placed therebetween to divide driving rows.

This embodiment can be implemented in an appropriate combination with any of the structures described in the other embodiments.

Embodiment 2

In this embodiment, a structure example of a display apparatus using a liquid crystal device and a structure example of a display apparatus using a light-emitting device will be described. Note that the description of the components, operations, and functions of the display apparatus described in Embodiment 1 is omitted in this embodiment.

The pixel described in Embodiment 1 can be used in the display apparatus described in this embodiment. Note that a scan line driver circuit and a signal line driver circuit which are described below correspond to the gate driver and the source driver, respectively.

Figure 20A:
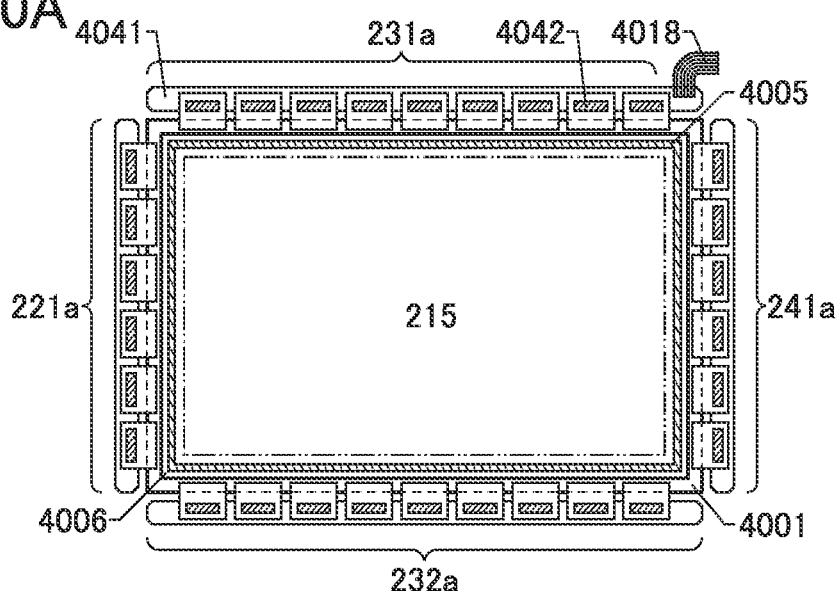
FIG. 20A to FIG. 20C are diagrams illustrating display apparatuses.
Figure 20B:
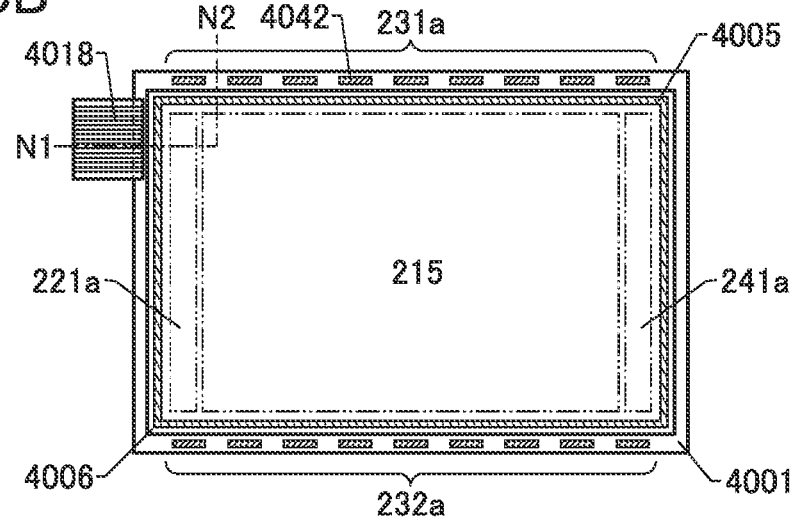
Figure 20C:
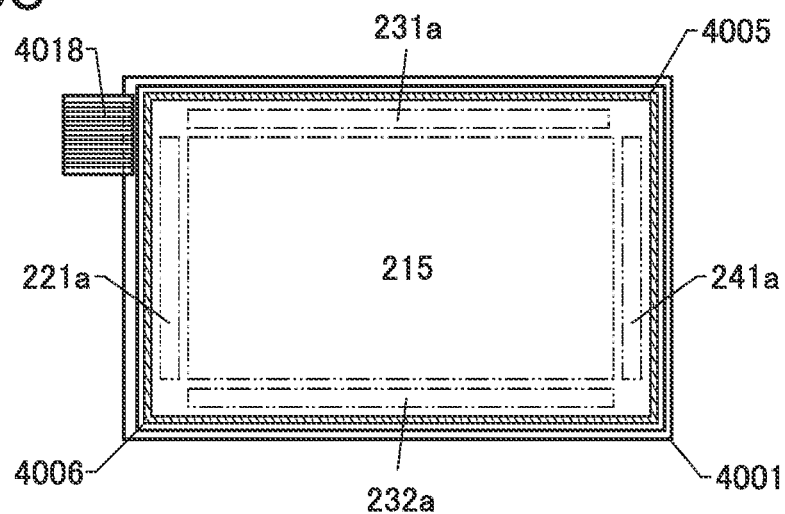

FIG. 20A to FIG. 20C are diagrams each illustrating a structure of a display apparatus in which one embodiment of the present invention can be used.

In FIG. 20A, a sealant 4005 is provided to surround a display portion 215 provided over a first substrate 4001, and the display portion 215 is sealed with the sealant 4005 and a second substrate 4006.

In FIG. 20A, a scan line driver circuit 221a, a signal line driver circuit 231a, a signal line driver circuit 232a, and a common line driver circuit 241a each include a plurality of integrated circuits 4042 provided over a printed circuit board 4041. The integrated circuits 4042 are each formed using a single crystal semiconductor or a polycrystalline semiconductor. The common line driver circuit 241a has a function of supplying a prescribed potential to the wirings 123, 124, 129, 130, 131, and the like described in Embodiment 1.

Signals and potentials are supplied to the scan line driver circuit 221a, the common line driver circuit 241a, the signal line driver circuit 231a, and the signal line driver circuit 232a through an FPC (Flexible printed circuit) 4018.

The integrated circuits 4042 included in the scan line driver circuit 221a and the common line driver circuit 241a each have a function of supplying a selection signal to the display portion 215. The integrated circuits 4042 included in the signal line driver circuit 231a and the signal line driver circuit 232a each have a function of supplying image data to the display portion 215. The integrated circuits 4042 are mounted in a region different from the region surrounded by the sealant 4005 over the first substrate 4001.

Note that the connection method of the integrated circuits 4042 is not particularly limited; a wire bonding method, a COF (Chip On Film) method, a COG (Chip On Glass) method, a TCP (Tape Carrier Package) method, or the like can be used.

FIG. 20B illustrates an example in which the integrated circuits 4042 included in the signal line driver circuit 231a and the signal line driver circuit 232a are mounted by a COG method. Some or all of the driver circuits can be formed over the same substrate as the display portion 215, whereby a system-on-panel can be formed.

In the example illustrated in FIG. 20B, the scan line driver circuit 221a and the common line driver circuit 241a are formed over the same substrate as the display portion 215. When the driver circuits are formed concurrently with pixel circuits in the display portion 215, the number of components can be reduced. Accordingly, the productivity can be increased.

In FIG. 20B, the sealant 4005 is provided to surround the display portion 215, the scan line driver circuit 221a, and the common line driver circuit 241a provided over the first substrate 4001. The second substrate 4006 is provided over the display portion 215, the scan line driver circuit 221a, and the common line driver circuit 241a. Consequently, the display portion 215, the scan line driver circuit 221a, and the common line driver circuit 241a are sealed with the use of the first substrate 4001, the sealant 4005, and the second substrate 4006 together with the display device.

Although the signal line driver circuit 231a and the signal line driver circuit 232a are separately formed and mounted on the first substrate 4001 in the example illustrated in FIG. 20B, one embodiment of the present invention is not limited to this structure. The scan line driver circuit may be separately formed and then mounted, part of the signal line driver circuits or part of the scan line driver circuits may be separately formed and then mounted. The signal line driver circuit 231*a* and the signal line driver circuit 232*a* may be formed over the same substrate as the display portion 215, as illustrated in FIG. 20C.

In some cases, the display device encompasses a panel in which the display device is sealed, and a module in which an IC or the like including a controller is mounted on the panel.

The display portion and the scan line driver circuit provided over the first substrate each include a plurality of transistors. As the transistors, the Si transistor or the OS transistor described in Embodiment 1 can be used.

The transistors included in the peripheral driver circuit and transistors included in the pixel circuits of the display portion may have the same structure or different structures. The transistors included in the peripheral driver circuit may have the same structure, or two or more kinds of structures may be used in combination. Similarly, the transistors included in the pixel circuits may have the same structure, or two or more kinds of structures may be used in combination.

An input apparatus 4200 can be provided over the second substrate 4006. The display apparatuses illustrated in FIG. 20A to FIG. 20C and provided with the input apparatus 4200 can function as a touch panel.

There is no particular limitation on a sensor device (also referred to as a sensor element) included in the touch panel of one embodiment of the present invention. A variety of sensors capable of sensing an approach or a contact of a sensing target such as a finger or a stylus can be used as the sensor device.

For example, a variety of types such as a capacitive type, a resistive type, a surface acoustic wave type, an infrared type, an optical type, and a pressure-sensitive type can be used for the sensor.

In this embodiment, a touch panel including a capacitive sensor device will be described as an example.

Examples of the capacitive sensor device include a surface capacitive sensor device and a projected capacitive sensor device. Examples of the projected capacitive sensor device include a self-capacitive sensor device and a mutual capacitive sensor device. The use of a mutual capacitive sensor device is preferred because multiple points can be sensed simultaneously.

The touch panel of one embodiment of the present invention can have any of a variety of structures, including a structure in which a display apparatus and a sensor device that are separately formed are attached to each other and a structure in which an electrode and the like included in a sensor device are provided on one or both of a substrate supporting a display device and a counter substrate.

Figure 21A:
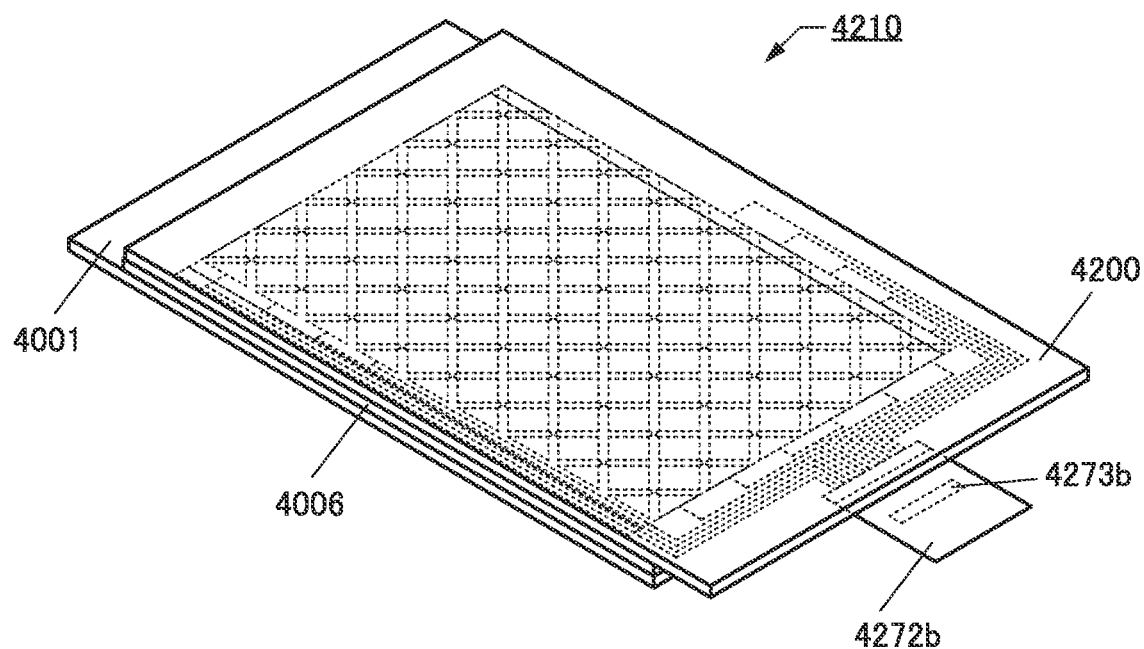
FIG. 21A and FIG. 21B are diagrams illustrating a touch panel.
Figure 21B:
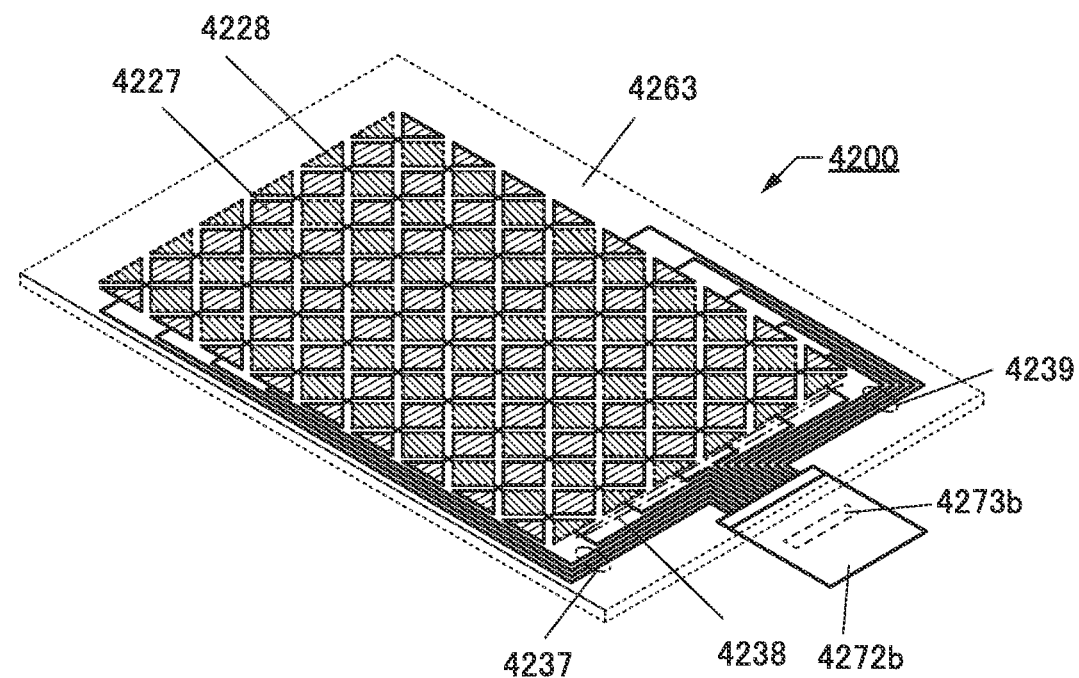

FIG. 21A and FIG. 21B illustrate an example of the touch panel. FIG. 21A is a perspective view of a touch panel 4210. FIG. 21B is a schematic perspective view of the input apparatus 4200. Note that for clarity, only typical components are illustrated.

The touch panel 4210 has a structure in which a display apparatus and a sensor device that are separately formed are attached to each other.

The touch panel 4210 includes the input apparatus 4200 and the display apparatus, which are provided to overlap with each other.

The input apparatus 4200 includes a substrate 4263, an electrode 4227, an electrode 4228, a plurality of wirings 4237, a plurality of wirings 4238, and a plurality of wirings 4239. The electrode 4227 can be electrically connected to the wiring 4237 or the wiring 4239, for example. In addition, the electrode 4228 can be electrically connected to the wiring 4239. An FPC 4272*b* is electrically connected to each of the plurality of wirings 4237 and the plurality of wirings 4238. An IC 4273*b* can be provided for the FPC 4272*b*.

Alternatively, a touch sensor may be provided between the first substrate 4001 and the second substrate 4006 in the display apparatus. In the case where a touch sensor is provided between the first substrate 4001 and the second substrate 4006, either a capacitive touch sensor or an optical touch sensor including a photoelectric conversion element may be used.

FIG. 22A and FIG. 22B are cross-sectional views of a portion indicated by chain line N1-N2 in FIG. 20B. Display apparatuses illustrated in FIG. 22A and FIG. 22B each include an electrode 4015, and the electrode 4015 is electrically connected to a terminal included in the FPC 4018 through an anisotropic conductive layer 4019. In FIG. 22A and FIG. 22B, the electrode 4015 is electrically connected to a wiring 4014 in an opening formed in an insulating layer 4112, an insulating layer 4111, and an insulating layer 4110.

The electrode 4015 is formed of the same conductive layer as a first electrode layer 4030, and the wiring 4014 is formed of the same conductive layer as source electrodes and drain electrodes of a transistor 4010 and a transistor 4011.

The display portion 215 and the scan line driver circuit 221*a* provided over the first substrate 4001 each include a plurality of transistors. In FIG. 22A and FIG. 22B, the transistor 4010 included in the display portion 215 and the transistor 4011 included in the scan line driver circuit 221*a* are illustrated as an example. Note that in the examples illustrated in FIG. 22A and FIG. 22B, the transistor 4010 and the transistor 4011 are bottom-gate transistors but may be top-gate transistors.

In FIG. 22A and FIG. 22B, the insulating layer 4112 is provided over the transistor 4010 and the transistor 4011. In FIG. 22B, a partition wall 4510 is formed over the insulating layer 4112.

The transistor 4010 and the transistor 4011 are provided over an insulating layer 4102. The transistor 4010 and the transistor 4011 each include an electrode 4017 formed over the insulating layer 4111. The electrode 4017 can serve as a back gate electrode.

The display apparatuses illustrated in FIG. 22A and FIG. 22B each include a capacitor 4020. The capacitor 4020 includes an electrode 4021 formed in the same step as a gate electrode of the transistor 4010, an insulating layer 4103, and an electrode formed in the same step as the source electrode and the drain electrode. The capacitor 4020 is not limited to having this structure and may be formed using another conductive layer and another insulating layer.

The transistor 4010 provided in the display portion 215 is electrically connected to the display device. FIG. 22A illustrates an example of a liquid crystal display apparatus using a liquid crystal device as the display device. In FIG. 22A, a liquid crystal device 4013 serving as the display device includes the first electrode layer 4030, a second electrode layer 4031, and a liquid crystal layer 4008. Note that an insulating layer 4032 and an insulating layer 4033 functioning as alignment films are provided so that the liquid crystal layer 4008 is positioned therebetween. The second electrode layer 4031 is provided on the second substrate 4006 side, and the first electrode layer 4030 and the second electrode layer 4031 overlap with each other with the liquid crystal layer 4008 therebetween.

A liquid crystal device having a variety of modes can be used as the liquid crystal device 4013. For example, a liquid crystal device using a VA (Vertical Alignment) mode, a TN (Twisted Nematic) mode, an IPS (In-Plane-Switching) mode, an ASM (Axially Symmetric aligned Micro-cell) mode, an OCB (Optically Compensated Bend) mode, an FLC (Ferroelectric Liquid Crystal) mode, an AFLC (Anti-Ferroelectric Liquid Crystal) mode, an ECB (Electrically Controlled Birefringence) mode, a VA-IPS mode, a guest-host mode, or the like can be used.

As the liquid crystal display apparatus described in this embodiment, a normally black liquid crystal display apparatus such as a transmissive liquid crystal display apparatus employing a vertical alignment (VA) mode may be used. As the vertical alignment mode, an MVA (Multi-Domain Vertical Alignment) mode, a PVA (Patterned Vertical Alignment) mode, an ASV (Advanced Super View) mode, and the like can be used.

Note that the liquid crystal device is an element that controls transmission and non-transmission of light by the optical modulation action of liquid crystal. The optical modulation action of the liquid crystal is controlled by an electric field applied to the liquid crystal (including a horizontal electric field, a vertical electric field, and an oblique electric field). As the liquid crystal used for the liquid crystal device, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Although an example of a liquid crystal display apparatus including a liquid crystal device with a vertical electric field mode is illustrated in FIG. 22A, one embodiment of the present invention can be applied to a liquid crystal display apparatus including a liquid crystal device with a horizontal electric field mode. In the case of employing a horizontal electric field mode, liquid crystal exhibiting a blue phase for which an alignment film is not used may be used. The blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which a chiral material of 5 weight % or more is mixed is used for the liquid crystal layer 4008 in order to improve the temperature range. The liquid crystal composition that contains liquid crystal exhibiting a blue phase and a chiral material has a short response speed and exhibits optical isotropy. In addition, the liquid crystal composition containing liquid crystal exhibiting a blue phase and a chiral material does not need alignment treatment and has small viewing angle dependence. Since an alignment film does not need to be provided and rubbing treatment is unnecessary, electrostatic discharge damage caused by the rubbing treatment can be prevented and defects or damage of the liquid crystal display apparatus in the manufacturing process can be reduced.

A spacer 4035 is a columnar spacer obtained by selective etching of an insulating layer and is provided in order to control a distance (a cell gap) between the first electrode layer 4030 and the second electrode layer 4031. Note that a spherical spacer may alternatively be used.

A black matrix (a light-blocking layer); a coloring layer (a color filter); an optical member (an optical substrate) such as a polarizing member, a retardation member, or an anti-reflection member; or the like may be provided as appropriate if needed. For example, circular polarization may be employed by using a polarizing substrate and a retardation substrate. In addition, a backlight, a side light, or the like may be used as a light source. A micro LED or the like may be used as the backlight or the side light.

In the display apparatus illustrated in FIG. 22A, a light-blocking layer 4132, a coloring layer 4131, and an insulating layer 4133 are provided between the second substrate 4006 and the second electrode layer 4031.

Examples of a material that can be used for the light-blocking layer include carbon black, titanium black, a metal, a metal oxide, and a composite oxide containing a solid solution of a plurality of metal oxides. The light-blocking layer may be a film containing a resin material or may be a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

Examples of a material that can be used for the coloring layer include a metal material, a resin material, and a resin material containing a pigment or a dye. The light-blocking layer and the coloring layer can be formed by, for example, an inkjet method or the like.

The display apparatuses illustrated in FIG. 22A and FIG. 22B each include the insulating layer 4111 and an insulating layer 4104. For the insulating layer 4111 and the insulating layer 4104, insulating layers through which an impurity element does not easily pass are used. A semiconductor layer of the transistor is positioned between the insulating layer 4111 and the insulating layer 4104, whereby entry of impurities from the outside can be prevented.

A light-emitting device can be used as the display device included in the display apparatus. As the light-emitting device, for example, an EL device that utilizes electroluminescence can be used. An EL device includes a layer containing a light-emitting compound (also referred to as an "EL layer") between a pair of electrodes. By generating a potential difference between the pair of electrodes that is greater than the threshold voltage of the EL device, holes are injected to the EL layer from the anode side and electrons are injected to the EL layer from the cathode side. The injected electrons and holes are recombined in the EL layer and a light-emitting compound contained in the EL layer emits light.

As the EL device, an organic EL device or an inorganic EL device can be used, for example. Note that an LED (including a micro LED), which uses a compound semiconductor as a light-emitting material, is an EL element, and can also be used.

Note that in addition to the light-emitting compound, the EL layer may further include a substance with a high hole-injection property, a substance with a high hole-transport property, a hole-blocking material, a substance with a high electron-transport property, a substance with a high electron-injection property, a substance with a bipolar property (a substance with a high electron- and hole-transport property), or the like.

The EL layer can be formed by a method such as an evaporation method (including a vacuum evaporation method), a transfer method, a printing method, an inkjet method, or a coating method.

The inorganic EL devices are classified according to their element structures into a dispersion-type inorganic EL device and a thin-film inorganic EL device. A dispersion-type inorganic EL device includes a light-emitting layer where particles of a light-emitting material are dispersed in a binder, and its light emission mechanism is donor-acceptor recombination type light emission that utilizes a donor level and an acceptor level. A thin-film inorganic EL device has a structure where a light-emitting layer is positioned between dielectric layers, which are further positioned between electrodes, and its light emission mechanism is localization type light emission that utilizes inner-shell electron transition of metal ions. Note that the description is made here using an organic EL device as the light-emitting device.

In order to extract light emitted from the light-emitting device, at least one of the pair of electrodes needs to be transparent. A transistor and a light-emitting device are formed over a substrate. The light-emitting device can have a top emission structure in which light emission is extracted from the surface on the side opposite to the substrate; a bottom emission structure in which light emission is extracted from the surface on the substrate side; or a dual emission structure in which light emission is extracted from both surfaces. The light-emitting device having any of the emission structures can be used.

FIG. 22B illustrates an example of a light-emitting display apparatus using a light-emitting device as a display device (also referred to as an "EL display apparatus"). A light-emitting device 4513 serving as the display device is electrically connected to the transistor 4010 provided in the display portion 215. Note that the structure of the light-emitting device 4513 is a stacked-layer structure of the first electrode layer 4030, a light-emitting layer 4511, and the second electrode layer 4031; however, this embodiment is not limited to this structure. The structure of the light-emitting device 4513 can be changed as appropriate depending on the direction in which light is extracted from the light-emitting device 4513, or the like.

The partition wall 4510 is formed using an organic insulating material or an inorganic insulating material. It is particularly preferable that the partition wall 4510 be formed using a photosensitive resin material to have an opening over the first electrode layer 4030 such that a side surface of the opening slopes with continuous curvature.

The light-emitting layer 4511 may be formed using a single layer or a plurality of layers stacked.

The emission color of the light-emitting device 4513 can be white, red, green, blue, cyan, magenta, yellow, or the like depending on the material for the light-emitting layer 4511.

As a color display method, there are a method in which the light-emitting device 4513 that emits white light is combined with a coloring layer and a method in which the light-emitting device 4513 that emits light of a different emission color is provided in each pixel. The former method is more productive than the latter method. In contrast, the latter method, which requires separate formation of the light-emitting layer 4511 pixel by pixel, is less productive than the former method. However, the latter method can provide higher color purity of the emission color than the former method. In the latter method, the color purity can be further increased when the light-emitting device 4513 has a microcavity structure.

Note that the light-emitting layer 4511 may contain an inorganic compound such as quantum dots. For example, when used for the light-emitting layer, the quantum dots can function as a light-emitting material.

A protective layer may be formed over the second electrode layer 4031 and the partition wall 4510 in order to prevent entry of oxygen, hydrogen, moisture, carbon dioxide, or the like into the light-emitting device 4513. For the protective layer, silicon nitride, silicon nitride oxide, aluminum oxide, aluminum nitride, aluminum oxynitride, aluminum nitride oxide, DLC (Diamond Like Carbon), or the like can be used. In a space enclosed by the first substrate 4001, the second substrate 4006, and the sealant 4005, a filler 4514 is provided for sealing. It is preferable that the light-emitting element be packaged (sealed) with a protective film (such as a laminate film or an ultraviolet curable resin film) or a cover member with high air-tightness and little degasification in this manner so that the light-emitting element is not exposed to the outside air.

As the filler 4514, an ultraviolet curable resin or a thermosetting resin can be used as well as an inert gas such as nitrogen or argon; PVC (polyvinyl chloride), an acrylic resin, polyimide, an epoxy-based resin, a silicone-based resin, PVB (polyvinyl butyral), EVA (ethylene vinyl acetate), or the like can be used. A drying agent may be contained in the filler 4514.

A glass material such as a glass frit or a resin material such as a curable resin that is curable at room temperature, such as a two-component-mixture-type resin, a light curable resin, or a thermosetting resin can be used for the sealant 4005. A drying agent may be contained in the sealant 4005.

If necessary, an optical film such as a polarizing plate, a circularly polarizing plate (including an elliptically polarizing plate), a retardation plate (a quarter-wave plate or a half-wave plate), or a color filter may be provided as appropriate on an emission surface of the light-emitting device. Furthermore, the polarizing plate or the circularly polarizing plate may be provided with an anti-reflection film. For example, anti-glare treatment by which reflected light can be diffused by projections and depressions on a surface so as to reduce the glare can be performed.

When the light-emitting device has a microcavity structure, light with high color purity can be extracted. Furthermore, when a microcavity structure and a color filter are used in combination, the glare can be reduced and visibility of a displayed image can be increased.

The first electrode layer and the second electrode layer (also called a pixel electrode layer, a common electrode layer, a counter electrode layer, or the like) for applying voltage to the display device each have a light-transmitting property or a light-reflecting property, which depends on the direction in which light is extracted, the position where the electrode layer is provided, and the pattern structure of the electrode layer.

Each of the first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

Each of the first electrode layer 4030 and the second electrode layer 4031 can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a metal nitride thereof.

A conductive composition containing a conductive high molecule (also referred to as conductive polymer) can be used for the first electrode layer 4030 and the second electrode layer 4031. As the conductive high molecule, a π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Since the transistor is easily broken by static electricity or the like, a protective circuit for protecting the driver circuit is preferably provided. The protective circuit is preferably formed using a nonlinear element.

Figure 23:
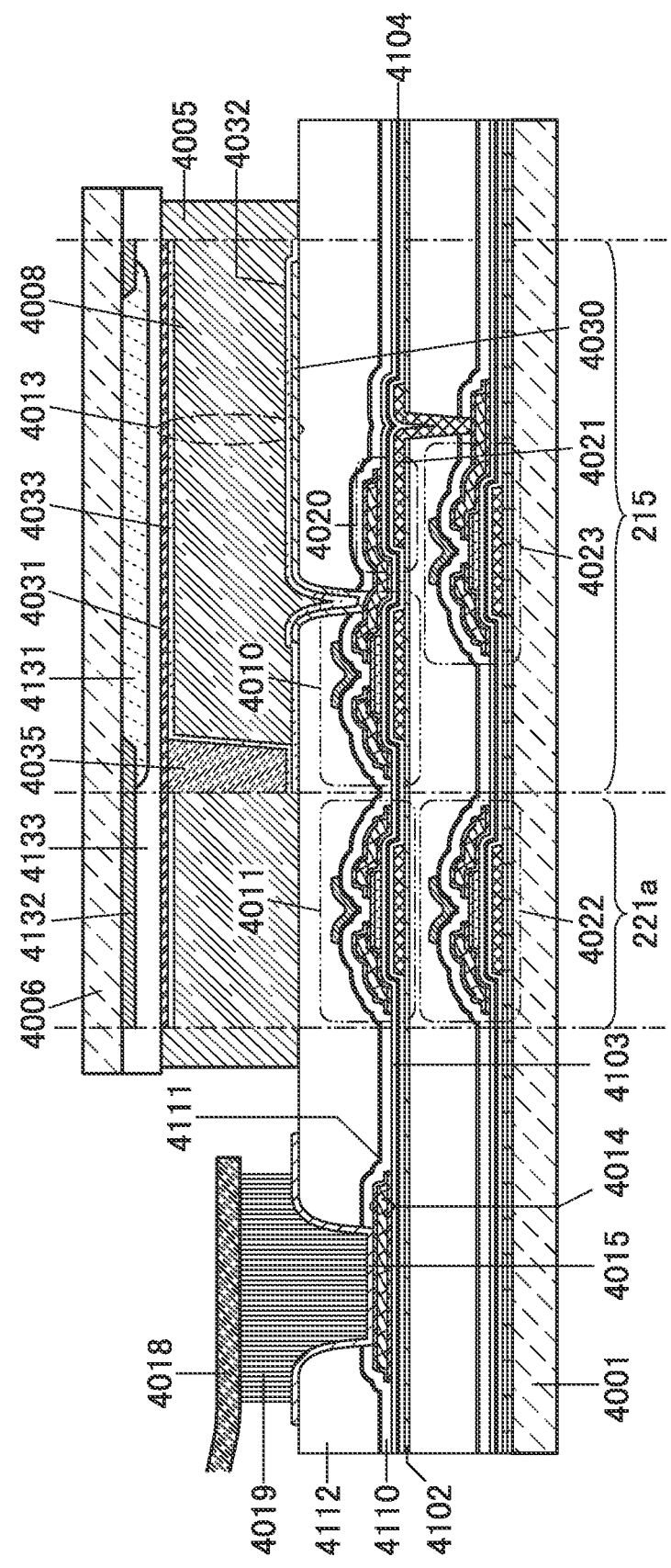
FIG. 23 is a diagram illustrating a display apparatus.

Note that as illustrated in FIG. 23, a stacked structure including a region where a transistor and a capacitor overlap with each other in the height direction may be employed. For example, when the transistor 4011 and a transistor 4022 included in the driver circuit are provided to overlap with each other, a display apparatus with a narrow frame can be provided. Furthermore, when the transistor 4010, a transistor 4023, the capacitor 4020, and the like included in the pixel circuit are provided to at least partly overlap with each other, the aperture ratio and the resolution can be improved. Although an example in which the stacked structure is employed for the liquid crystal display apparatus illustrated in FIG. 22A is illustrated in FIG. 23, the stacked structure may be employed for the EL display apparatus illustrated in FIG. 22B.

In addition, a light-transmitting conductive film with high visible-light-transmitting property is used as an electrode or a wiring in the pixel circuit, whereby transmittance of light in the pixel can be increased and the aperture ratio can be substantially improved. Note that in the case where an OS transistor is used, a semiconductor layer also has a light-transmitting property and thus the aperture ratio can be further increased. These are effective even when transistors and the like are not stacked.

The display apparatus may have a structure with a combination of a liquid crystal display apparatus and a light-emitting apparatus.

The light-emitting apparatus is disposed on the side opposite to the display surface or on an end portion of the display surface. The light-emitting apparatus has a function of supplying light to the display device. The light-emitting apparatus can also be referred to as a backlight.

Here, the light-emitting apparatus can include a plate-like or sheet-like light guide portion (also referred to as a light guide plate) and a plurality of light-emitting devices which emit light of different colors. When the light-emitting devices are disposed in the vicinity of the side surface of the light guide portion, light can be emitted from the side surface of the light guide portion to the inside. The light guide portion has a mechanism that changes an optical path (also referred to as a light extraction mechanism), and this enables the light-emitting apparatus to emit light uniformly to a pixel portion of a display panel. Alternatively, the light-emitting apparatus may be provided directly under the pixel without providing the light guide portion.

The light-emitting apparatus preferably includes light-emitting devices of three colors, red (R), green (G), and blue (B). In addition, a light-emitting device of white (W) may be included. A light emitting diode (LED) is preferably used as these light-emitting devices.

Furthermore, the light-emitting devices preferably have extremely high color purities; the full width at half maximum (FWHM) of the emission spectrum of the light-emitting device is less than or equal to 50 nm, preferably less than or equal to 40 nm, further preferably less than or equal to 30 nm, still further preferably less than or equal to 20 nm. Note that the full width at half maximum of the emission spectrum is preferably as small as possible, and can be, for example, greater than or equal to 1 nm. Thus, when a color image is displayed, a vivid image with high color reproducibility can be displayed.

As the red light-emitting device, an element whose wavelength of an emission spectrum peak is in a range from 625 nm to 650 nm is preferably used. As the green light-emitting device, an element whose wavelength of an emission spectrum peak is in a range from 515 nm to 540 nm is preferably used. As the blue light-emitting device, an element whose wavelength of an emission spectrum peak is in a range from 445 nm to 470 nm is preferably used.

The display apparatus can make the light-emitting devices of the three colors blink sequentially, drive the pixels in synchronization with these light-emitting elements, and display a color image on the basis of the successive additive color mixing method. This driving method can also be referred to as field-sequential driving.

By the field-sequential driving, a clear color image can be displayed. In addition, a smooth moving image can be displayed. When the above-described driving method is used, one pixel does not need to be formed with subpixels of different colors, which can make an effective reflection area (also referred to as an effective display area or an aperture ratio) per pixel large; thus, a bright image can be displayed. Furthermore, the pixels do not need to be provided with color filters, and thus can have improved transmittance and achieve brighter image display. In addition, the manufacturing process can be simplified, and the manufacturing costs can be reduced.

FIG. 24A and FIG. 24B each illustrate an example of a schematic cross-sectional view of a display apparatus capable of the field-sequential driving. A backlight unit capable of emitting light of RGB colors is provided on the first substrate 4001 side of the display apparatus. Note that in the field-sequential driving, the RGB colors are expressed through time division light emission, and thus color filters are not needed.

A backlight unit 4340a illustrated in FIG. 24A has a structure in which a plurality of light-emitting devices 4342 are provided directly under a pixel with a diffusing plate 4352 positioned therebetween. The diffusing plate 4352 have functions of diffusing light emitted from the light-emitting device 4342 to the first substrate 4001 side and making the luminance in a display portion uniform. Between the light-emitting device 4342 and the diffusing plate 4352, a polarizing plate may be provided if necessary. The diffusing plate 4352 does not need to be provided if not needed. The light-blocking layer 4132 may be omitted.

The backlight unit 4340a can include a large number of light-emitting devices 4342, which enables bright image display. Moreover, there are advantages that a light guide plate is not needed and light efficiency of the light-emitting device 4342 is less likely to be lowered. Note that the light-emitting device 4342 may be provided with a light diffusion lens 4344 if necessary.

A backlight unit 4340b illustrated in FIG. 24B has a structure in which a light guide plate 4341 is provided directly under a pixel with the diffusing plate 4352 positioned therebetween. The plurality of light-emitting devices 4342 are provided at an end portion of the light guide plate 4341. The light guide plate 4341 has an uneven shape on the side opposite to the diffusing plate 4352, and can scatter waveguided light with the uneven shape to emit the light in the direction of the diffusing plate 4352.

The light-emitting device 4342 can be fixed to a printed circuit board 4347. Note that in FIG. 24B, the light-emitting devices 4342 of RGB colors overlap with each other; however, the light-emitting devices 4342 of RGB colors can be arranged to be lined up in the depth direction. A reflective layer 4348 that reflects visible light may be provided on the side surface of the light guide plate 4341 which is opposite to the light-emitting device 4342.

The backlight unit 4340*b* can reduce the number of light-emitting devices 4342, leading to reductions in cost and thickness.

A light-scattering liquid crystal device may be used as the liquid crystal device. The light-scattering liquid crystal device is preferably an element containing a composite material of liquid crystal and a polymer molecule. For example, a polymer dispersed liquid crystal device can be used. Alternatively, a polymer network liquid crystal (PNLC) element may be used.

The light-scattering liquid crystal device has a structure in which a liquid crystal portion is provided in a three-dimensional network structure of a resin portion sandwiched between a pair of electrodes. As a material used in the liquid crystal portion, for example, a nematic liquid crystal can be used. A photocurable resin can be used for the resin portion. The photocurable resin can be a monofunctional monomer, such as acrylate or methacrylate; a polyfunctional monomer, such as diacrylate, triacrylate, dimethacrylate, or trimethacrylate; or a polymerizable compound obtained by mixing these.

The light-scattering liquid crystal device displays an image by transmitting or scattering light utilizing the anisotropy of a refractive index of a liquid crystal material. The resin portion may have the anisotropy of a refractive index. When liquid crystal molecules are arranged in a certain direction in accordance with a voltage applied to the light-scattering liquid crystal device, a direction is generated at which a difference in a refractive index between the liquid crystal portion and the resin portion is small. Incident light along the direction passes without being scattered in the liquid crystal portion. Thus, the light-scattering liquid crystal device is perceived in a transparent state from the direction. By contrast, when liquid crystal molecules are arranged randomly in accordance with the applied voltage, a large difference in refractive index between the liquid crystal portion and the resin portion is not generated, and incident light is scattered in the liquid crystal portion. Thus, the light-scattering liquid crystal device is in an opaque state regardless of the viewing direction.

FIG. 25A illustrates a structure in which the liquid crystal device 4013 of the display apparatus illustrated in FIG. 24A is replaced by a light-scattering liquid crystal device 4016. The light-scattering liquid crystal device 4016 includes a composite layer 4009 including a liquid crystal portion and a resin portion, the first electrode layer 4030, and the second electrode layer 4031. Although components relating to the field-sequential driving are the same as those in FIG. 24A, when the light-scattering liquid crystal device 4016 is used, an alignment film and a polarizing plate are not necessary. Note that the spherical spacer 4035 is illustrated, but the spacer 4035 may have a columnar shape.

FIG. 25B illustrates a structure in which the liquid crystal device 4013 of the display apparatus illustrated in FIG. 24B is replaced by the light-scattering liquid crystal device 4016. In the structure of FIG. 24B, it is preferable that light be transmitted when a voltage is not applied to the light-scattering liquid crystal device 4016, and light be scattered when a voltage is applied. With such a structure, the display apparatus can be transparent in a normal state (state in which no image is displayed). In that case, a color image can be displayed when a light scattering operation is performed.

FIGS. 26A to FIG. 26E illustrate modification examples of the display apparatus in FIG. 25B. Note that in FIGS. 26A to FIG. 26E, some components in FIG. 25B are used and the other components are not illustrated for simplicity.

Figure 26A:
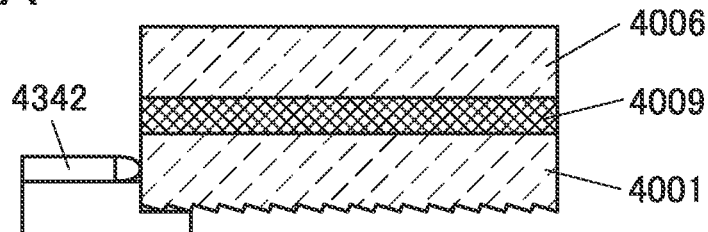
FIG. 26A to FIG. 26E are diagrams illustrating display apparatuses.

FIG. 26A illustrates a structure in which the first substrate 4001 has a function of a light guide plate. An uneven surface may be provided on an outer surface of the first substrate 4001. With this structure, a light guide plate does not need to be provided additionally, leading to a reduction in a manufacturing cost. Furthermore, the attenuation of light caused by the light guide plate also does not occur; accordingly, light emitted from the light-emitting device 4342 can be efficiently utilized.

Figure 26B:
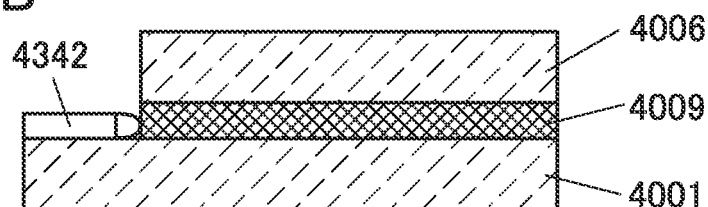

FIG. 26B illustrates a structure in which light enters from the vicinity of an end portion of the composite layer 4009. By utilizing total reflection at the interface between the composite layer 4009 and the second substrate 4006 and the interface between the composite layer 4009 and the first substrate 4001, light can be emitted to the outside from the light-scattering liquid crystal device. For the resin portion of the composite layer 4009, a material having a refractive index higher than that of the first substrate 4001 and that of the second substrate 4006 is used.

Figure 26C:
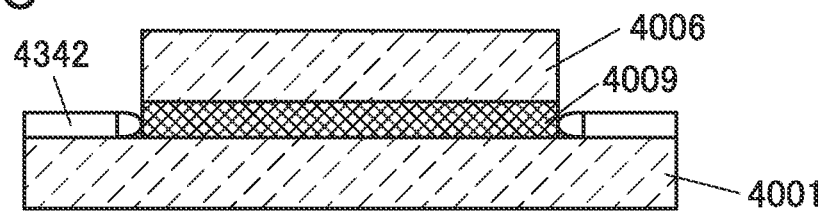

Note that the light-emitting device 4342 may be provided on one side of the display apparatus, or may be provided on each of two sides facing each other as illustrated in FIG. 26C. Furthermore, the light-emitting devices 4342 may be provided on three sides or four sides. When the light-emitting devices 4342 are provided on a plurality of sides, attenuation of light can be compensated for and application to a large-area display device is possible.

Figure 26D:
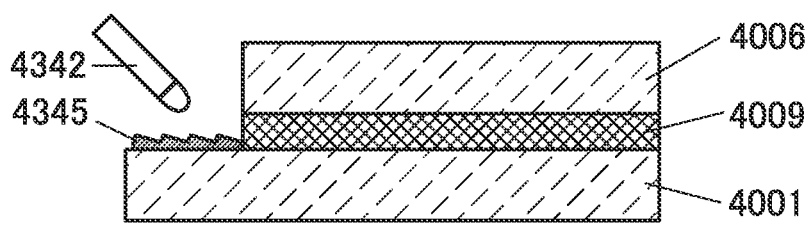

FIG. 26D illustrates a structure in which light emitted from the light-emitting device 4342 is guided to the display apparatus through a mirror 4345. With this structure, light can be guided easily with a certain angle to the display apparatus; thus, total reflection light can be obtained efficiently.

Figure 26E:
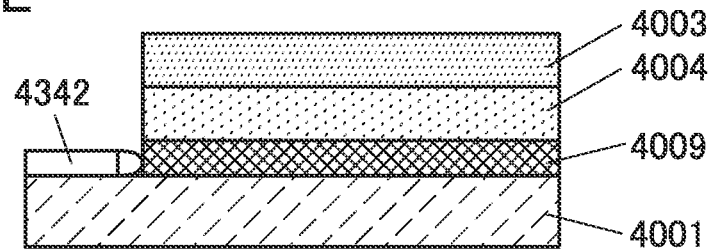

FIG. 26E illustrates a structure in which a layer 4003 and a layer 4004 are stacked over the composite layer 4009. One of the layer 4003 and the layer 4004 is a support such as a glass substrate, and the other can be formed of an inorganic film, a coating film of an organic resin, a film, or the like. For the resin portion of the composite layer 4009, a material having a refractive index higher than that of the layer 4004 is used. For the layer 4004, a material having a refractive index higher than that of the layer 4003 is used.

A first interface is formed between the composite layer 4009 and the layer 4004, and a second interface is formed between the layer 4004 and the layer 4003. With this structure, light passing through the first interface without being totally reflected is totally reflected at the second interface and can be returned to the composite layer 4009. Accordingly, light emitted from the light-emitting device 4342 can be efficiently utilized.

Note that the structures in FIG. 25B and FIGS. 26A to FIG. 26E can be combined with each other.

This embodiment can be implemented in an appropriate combination with the structures described in the other embodiments.

Embodiment 3

In this embodiment, examples of transistors which can be used as the transistors described in the above embodiments are described with reference to drawings.

The display apparatus of one embodiment of the present invention can be manufactured using a transistor with any of various structures, such as a bottom-gate transistor or a top-gate transistor. Therefore, a material of a semiconductor layer or the structure of a transistor can be easily changed depending on the existing production line.

[Bottom-Gate Transistor]

Figure 27A:
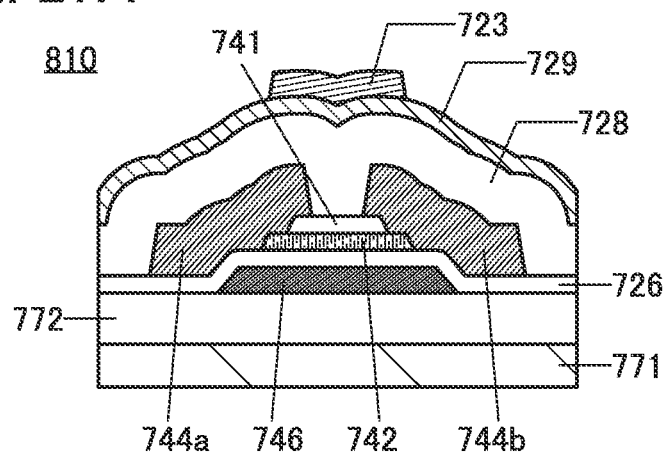
FIG. 27A to FIG. 27C are diagrams illustrating transistors.

FIG. 27A is a cross-sectional view of a channel-protective transistor 810, which is a type of bottom-gate transistor, in the channel length direction. In FIG. 27A, the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

Furthermore, an insulating layer 741 is provided over a channel formation region in the semiconductor layer 742. Furthermore, an electrode 744a and an electrode 744b are provided over the insulating layer 726 to be partly in contact with the semiconductor layer 742. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions (n$^+$ layer). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

An electrode 723 that can function as a back gate electrode is provided over the insulating layer 729. The electrode 723 can be formed using a material and a method similar to those for the electrode 746. Note that the electrode 723 does not have to be provided.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or a given potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". In the transistor 810, for example, in the case where the electrode 723 is referred to as a "gate electrode", the electrode 746 is referred to as a "back gate electrode". In the case where the electrode 723 is used as a "gate electrode", the transistor 810 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 810 is increased and the field-effect mobility is increased.

Therefore, the transistor 810 is a transistor having a high on-state current for its occupation area. That is, the occupation area of the transistor 810 can be small for required on-state current.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

Figure 27B:
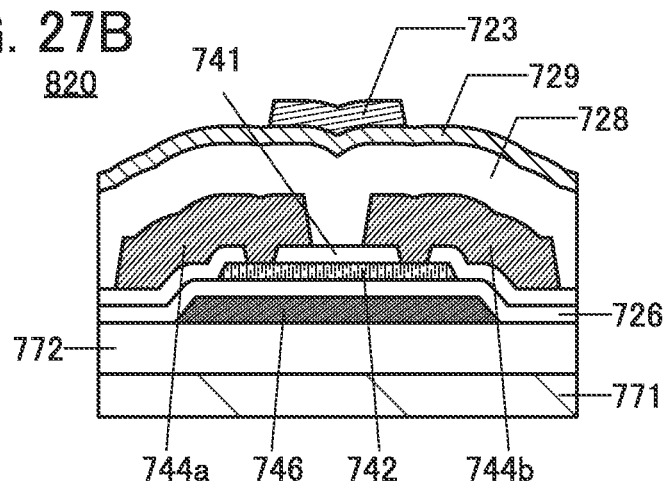

FIG. 27B is a cross-sectional view of a channel-protective transistor 820, which has a structure different from FIG. 27A, in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening formed by selectively removing part of the insulating layer 741 that overlaps with the semiconductor layer 742. The semiconductor layer 742 is electrically connected to the electrode 744b through another opening formed by selectively removing part of the insulating layer 741 that overlaps with the semiconductor layer 742. A region of the insulating layer 741 that overlaps with the channel formation region can function as a channel protective layer.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 than in the transistor 810. Thus, the parasitic capacitance generated between the electrode 744a and the electrode 746 can be reduced. Moreover, the parasitic capacitance generated between the electrode 744b and the electrode 746 can be reduced.

Figure 27C:
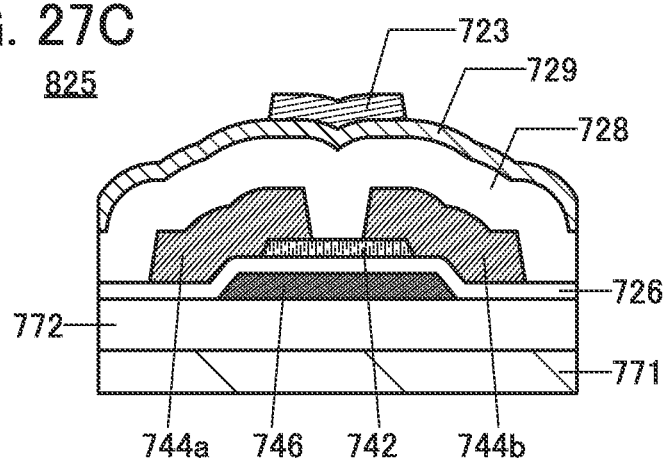

FIG. 27C is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

[Top-Gate Transistor]

Figure 28A:
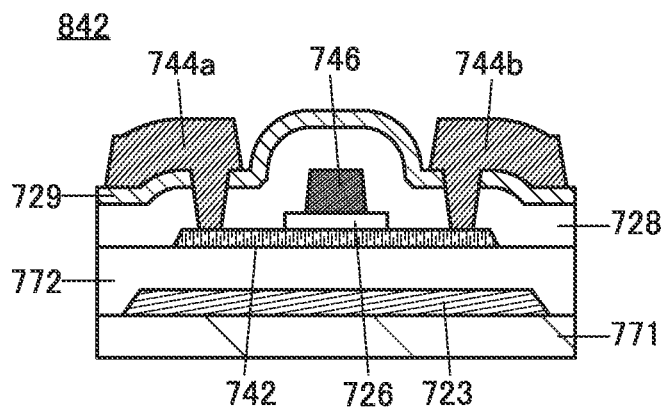
FIG. 28A to FIG. 28C are diagrams illustrating transistors.

A transistor 842 illustrated in FIG. 28A is a type of top-gate transistor. The electrode 744a and the electrode 744b are electrically connected to the semiconductor layer 742 through openings formed in the insulating layer 728 and the insulating layer 729.

Part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. Thus, an LDD (Lightly Doped Drain) region is formed in a region of the semiconductor layer 742 which overlaps with the insulating layer 726 but does not overlap with the electrode 746.

The transistor 842 includes the electrode 723 that is formed over the substrate 771. The electrode 723 includes a region overlapped by the semiconductor layer 742 with the insulating layer 772 therebetween. The electrode 723 can function as a back gate electrode. Note that the electrode 723 does not have to be provided.

Figure 28B:
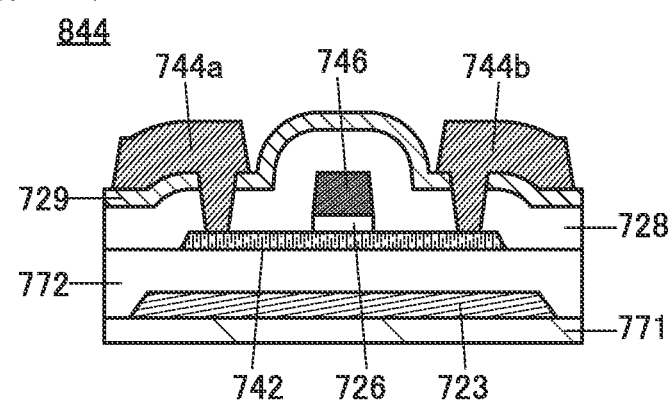
Figure 28C:
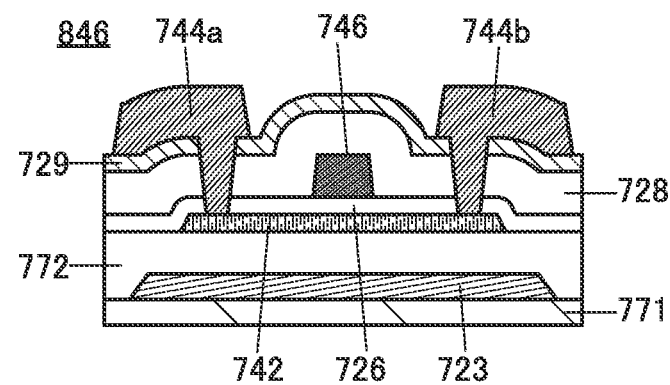

As in a transistor 844 illustrated in FIG. 28B, the insulating layer 726 in a region that does not overlap with the electrode 746 may be completely removed. Alternatively, the insulating layer 726 may be left as in a transistor 846 illustrated in FIG. 28C.

Figure 29A:
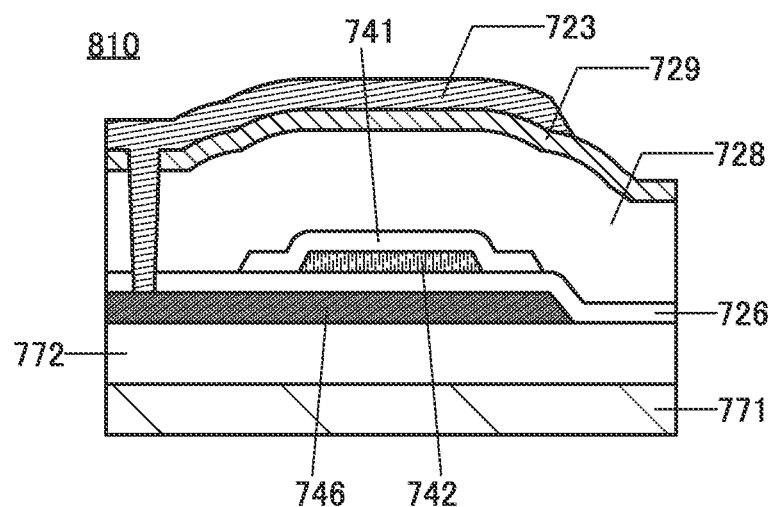
FIG. 29A and FIG. 29B are diagrams illustrating transistors.
Figure 29B:
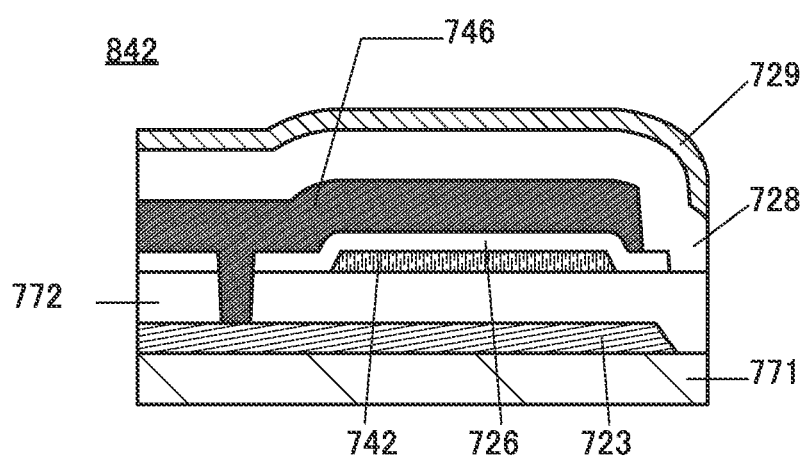

FIG. 29A shows a cross-sectional view of the transistor 810 in the channel width direction, and FIG. 29B shows a cross-sectional view of the transistor 842 in the channel width direction.

In each of the structures shown in FIG. 29A and FIG. 29B, the gate electrode is connected to the back gate electrode, and the potentials of the gate electrode and the back gate electrode become equal to each other. In addition, the semiconductor layer 742 is positioned between the gate electrode and the back gate electrode.

The length of each of the gate electrode and the back gate electrode in the channel width direction is larger than the length of the semiconductor layer 742 in the channel width direction. In the channel width direction, the entire semiconductor layer 742 is covered with the gate electrode or the back gate electrode with insulating layers positioned therebetween.

This structure enables the semiconductor layer 742 included in the transistor to be electrically surrounded by electric fields of the gate electrode and the back gate electrode.

The transistor device structure in which the semiconductor layer 742 in which the channel formation region is formed is electrically surrounded by electric fields of the gate electrode and the back gate electrode in this manner can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

Note that a configuration where the gate electrode and the back gate electrode are not connected to each other and are supplied with different potentials may be employed. For example, supplying a constant potential to the back gate electrode can control the threshold voltage of the transistor.

This embodiment can be implemented in an appropriate combination with any of the structures described in the other embodiments.

Embodiment 4

Examples of an electronic device that can use the display apparatus of one embodiment of the present invention include display appliances, personal computers, image storage devices and image reproducing devices provided with storage media, mobile phones, game machines including portable game machines, portable data terminals, e-book readers, cameras such as video cameras and digital still cameras, goggles-type displays (head mounted displays), navigation systems, audio reproducing devices (e.g., car audio players and digital audio players), copiers, facsimiles, printers, multifunction printers, automated teller machines (ATM), and vending machines. FIG. 30A to FIG. 30F illustrate specific examples of such electronic devices.

Figure 30A:
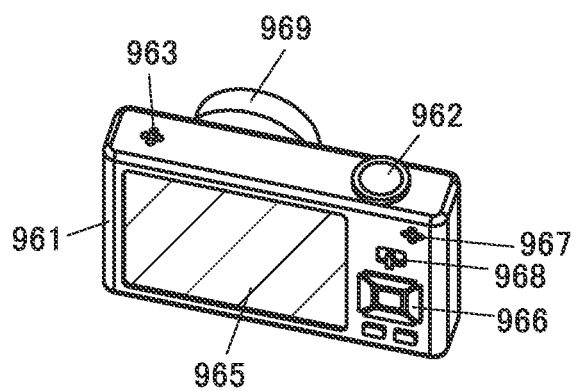
FIG. 30A to FIG. 30F are diagrams illustrating electronic devices.

FIG. 30A illustrates a digital camera, which includes a housing 961, a shutter button 962, a microphone 963, a speaker 967, a display portion 965, operation keys 966, a zoom lever 968, a lens 969, and the like. The display apparatus of one embodiment of the present invention can be used for the display portion 965.

Figure 30B:
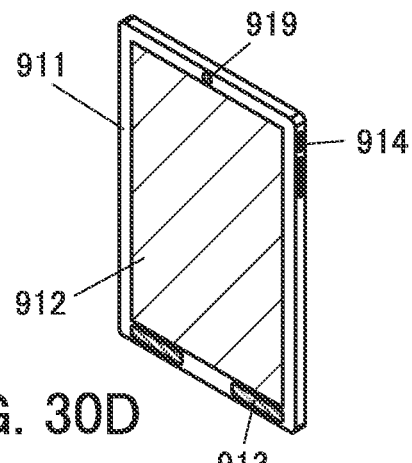

FIG. 30B illustrates a portable data terminal, which includes a housing 911, a display portion 912, speakers 913, an operation button 914, a camera 919, and the like. A touch panel function of the display portion 912 enables input and output of information. The display apparatus of one embodiment of the present invention can be used for the display portion 912.

Figure 30C:
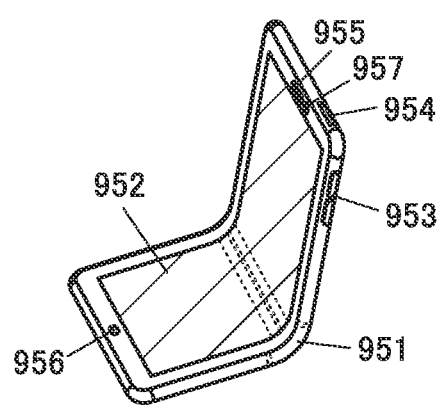

FIG. 30C illustrates a mobile phone, which includes a housing 951, a display portion 952, an operation button 953, an external connection port 954, a speaker 955, a microphone 956, a camera 957, and the like. The display portion 952 of the mobile phone includes a touch sensor. Operations such as making a call and inputting text can be performed by touch on the display portion 952 with a finger, a stylus, or the like. The housing 951 and the display portion 952 have flexibility and can be used in a bent state as illustrated in the diagram. The display apparatus of one embodiment of the present invention can be used for the display portion 952.

Figure 30D:
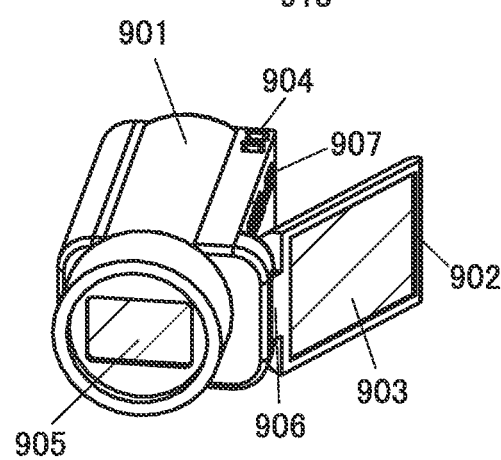

FIG. 30D illustrates a video camera, which includes a first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. The display apparatus of one embodiment of the present invention can be used for the display portion 903.

Figure 30E:
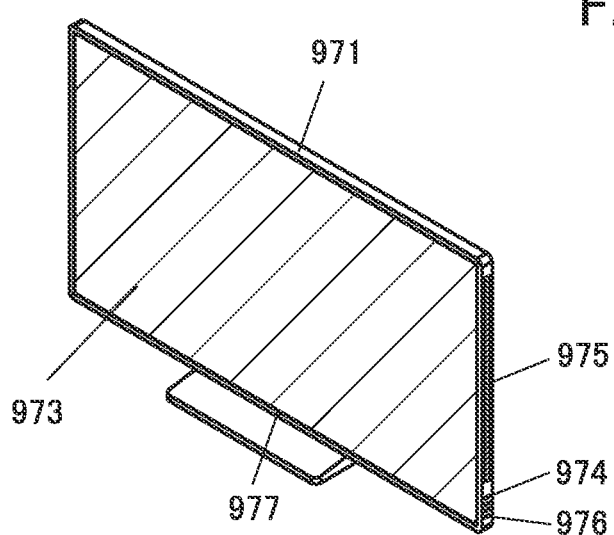

FIG. 30E illustrates a television, which includes a housing 971, a display portion 973, an operation button 974, speakers 975, a communication connection terminal 976, an optical sensor 977, and the like. The display portion 973 includes a touch sensor that enables an input operation. The display apparatus of one embodiment of the present invention can be used for the display portion 973.

Figure 30F:
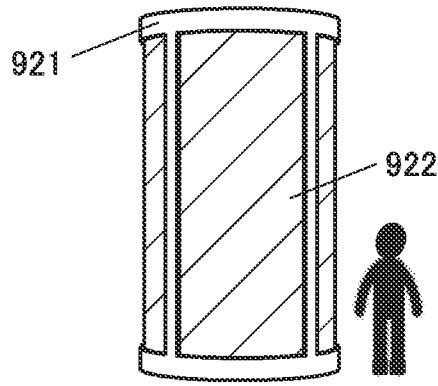

FIG. 30F illustrates digital signage, which includes a large display portion 922. The large display portion 922 in the digital signage is attached to a side surface of a pillar 921, for example. The display apparatus of one embodiment of the present invention can be used for the display portion 922.

This embodiment can be implemented in an appropriate combination with any of the structures described in the other embodiments.

REFERENCE NUMERALS

10: pixel, 11: pixel array, 12: pixel, 20: source driver, 30: gate driver, 40: circuit, 51: conductive layer, 51a: conductive layer, 51b: conductive layer, 52: conductive layer, 52a: conductive layer, 52b: conductive layer, 53: conductive layer, 54: conductive layer, 55: connection wiring, 61: dielectric layer, 62: dielectric layer, 62a: dielectric layer, 62b: dielectric layer, 63: protective layer, 101: transistor, 102: transistor, 103: transistor, 104: transistor, 105: transistor, 106: capacitor, 106a: capacitor, 106b: capacitor, 107: capacitor, 108: light-emitting device, 109: transistor, 110: liquid crystal device, 121: wiring, 122: wiring, 123: wiring, 124: wiring, 125: wiring, 126: wiring, 127: wiring, 129: wiring, 130: wiring, 131: wiring, 160: opening, 161: opening, 162: opening, 165: opening, 215: display portion, 221a: scan line driver circuit, 231a: signal line driver circuit, 232a: signal line driver circuit, 241a: common line driver circuit, 723: electrode, 726: insulating layer, 728: insulating layer, 729: insulating layer, 741: insulating layer, 742: semiconductor layer, 744a: electrode, 744b: electrode, 746: electrode, 771: substrate, 772: insulating layer, 810: transistor, 820: transistor, 825: transistor, 842: transistor, 844: transistor, 846: transistor, 901: housing, 902: housing, 903: display portion, 904: operation key, 905: lens, 906: connection portion, 907: speaker, 911: housing, 912: display portion, 913: speaker, 914: operation button, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation button, 975: speaker, 976: communication connection terminal, 977: optical sensor, 4001: substrate, 4003: layer, 4004: layer, 4005: sealant, 4006: substrate, 4008: liquid crystal layer, 4009: composite layer, 4010: transistor, 4011: transistor, 4013: liquid crystal device, 4014: wiring, 4015: electrode, 4016: light-scattering liquid crystal device, 4017: electrode, 4018: FPC, 4019: anisotropic conductive layer, 4020: capacitor, 4021: electrode, 4022: transistor, 4023: transistor, 4030: electrode layer, 4031: electrode layer, 4032: insulating layer, 4033: insulating layer, 4035: spacer, 4041: printed circuit board, 4042: integrated circuit, 4102: insulating layer, 4103: insulating layer, 4104: insulating layer, 4110: insulating layer, 4111: insulating layer, 4112: insulating layer, 4131: coloring layer, 4132: light-blocking layer, 4133: insulating layer, 4200: input apparatus, 4210: touch panel, 4227: electrode, 4228: electrode, 4237: wiring, 4238: wiring, 4239: wiring, 4263: substrate, 4272b: FPC, 4273b: IC, 4340a: backlight unit, 4340b: backlight unit, 4341: light guide plate, 4342: light-emitting device, 4344: lens, 4345: mirror, 4347: printed circuit board, 4348: reflective layer, 4352: diffusing plate, 4510: partition wall, 4511: light-emitting layer, 4513: light-emitting device, 4514: filler

The invention claimed is:
1. A display apparatus comprising a pixel,
wherein the pixel comprises a first capacitor, a second capacitor, a display element, a first transistor, a second transistor, a third transistor, and an insulating layer,
wherein the first capacitor and the second capacitor are electrically connected to the display element,
wherein the first capacitor comprises a structure in which a first conductive layer, a first dielectric layer, and a second conductive layer are stacked in this order,
wherein the second capacitor comprises a structure in which a third conductive layer, a second dielectric layer, and a fourth conductive layer are stacked in this order,
wherein the first capacitor comprises a region overlapping with the second capacitor,
wherein the insulating layer comprises a region sandwiched between the second conductive layer and the third conductive layer,
wherein the insulating layer comprises a first opening portion in a region not overlapping with the first conductive layer,
wherein the second conductive layer and the third conductive layer are in direct contact with each other in the first opening portion,
wherein one of a source and a drain of the first transistor is electrically connected to the second conductive layer and the third conductive layer, wherein one of a source and a drain of the second transistor and one of a source and a drain of the third transistor are electrically connected to the first conductive layer, and wherein the second dielectric layer is over the first transistor.

2. The display apparatus according to claim 1, wherein the second dielectric layer has a stacked structure of an inorganic insulating layer and an organic insulating layer.

3. The display apparatus according to claim 2, wherein a capacitance value of the first capacitor is higher than a capacitance value of the second capacitor.

4. The display apparatus according to claim 2, wherein the organic insulating layer comprises a second opening portion in a region overlapping with the third conductive layer and the first capacitor, and wherein the fourth conductive layer is provided in the second opening portion.

5. The display apparatus according to claim 1, wherein the second conductive layer and the third conductive layer have a same potential.

6. The display apparatus according to claim 1, wherein the insulating layer further comprises a plurality of second opening portions in the region sandwiched between the second conductive layer and the third conductive layer, and wherein the second conductive layer and the third conductive layer are in contact with each other in the plurality of second opening portions.

7. The display apparatus according to claim 1, wherein the first transistor, the second transistor, and the third transistor each comprise a metal oxide in a channel formation region.

8. The display apparatus according to claim 7, wherein the metal oxide comprises In, Zn, and M, and wherein M is at least one of Al, Ti, Ga, Ge, Sn, Y, Zr, La, Ce, Nd, and Hf.

9. The display apparatus according to claim 1, wherein the second conductive layer comprises a metal oxide.

10. The display apparatus according to claim 9, wherein the metal oxide comprises In, Zn, and M, and wherein M is at least one of Al, Ti, Ga, Ge, Sn, Y, Zr, La, Ce, Nd, and Hf.

11. The display apparatus according to claim 1, wherein the pixel comprises a light-emitting element as the display element, wherein the pixel further comprises a fourth transistor and a fifth transistor, wherein a gate of the fourth transistor is electrically connected to the second conductive layer, and wherein one of a source and a drain of the fourth transistor, one of a source and a drain of the fifth transistor, and one electrode of the light-emitting element are electrically connected to the fourth conductive layer.

12. The display apparatus according to claim 1, wherein the pixel comprises a liquid crystal element as the display element, and wherein one electrode of the liquid crystal element is electrically connected to the second conductive layer.

* * * * *